(12) United States Patent
Kato et al.

(10) Patent No.: US 9,153,313 B2
(45) Date of Patent: Oct. 6, 2015

(54) NORMALLY-OFF, POWER-GATED MEMORY CIRCUIT WITH TWO DATA RETENTION STAGES FOR REDUCING OVERHEAD POWER

(71) Applicant: SEMICONDUCTOR ENERGY LABORATORY CO., LTD., Atsugi-shi, Kanagawa-ken (JP)

(72) Inventors: Kiyoshi Kato, Kanagawa (JP); Takuro Ohmaru, Kanagawa (JP); Yasuyuki Takahashi, Miyagi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 5 days.

(21) Appl. No.: 14/223,071

(22) Filed: Mar. 24, 2014

(65) Prior Publication Data

US 2014/0293711 A1 Oct. 2, 2014

(30) Foreign Application Priority Data

Mar. 26, 2013 (JP) ................................. 2013-064503

(51) Int. Cl.
*G11C 11/40* (2006.01)
*G11C 11/4091* (2006.01)
*G11C 11/401* (2006.01)
*G11C 11/4074* (2006.01)

(52) U.S. Cl.
CPC .......... *G11C 11/4091* (2013.01); *G11C 11/401* (2013.01); *G11C 11/4074* (2013.01)

(58) Field of Classification Search
CPC ............. G11C 11/4091; G11C 11/401; G11C 11/4074
See application file for complete search history.

(56) References Cited

U.S. PATENT DOCUMENTS

| 5,731,856 A | 3/1998 | Kim et al. |
| 5,744,864 A | 4/1998 | Cillessen et al. |
| 6,294,274 B1 | 9/2001 | Kawazoe et al. |
| 6,563,174 B2 | 5/2003 | Kawasaki et al. |

(Continued)

FOREIGN PATENT DOCUMENTS

| EP | 1737044 A | 12/2006 |
| EP | 2226847 A | 9/2010 |

(Continued)

OTHER PUBLICATIONS

Ando Koji; "Nonvolatile Magnetic Memory"; FED Review, vol. 1, No. 14; pp. 1-8; Mar. 2002; with English translation.

(Continued)

*Primary Examiner* — J. H. Hur
(74) *Attorney, Agent, or Firm* — Fish & Richardson P.C.

(57) ABSTRACT

The first circuit has a function of retaining data in a first period during which a power supply voltage is supplied. The second circuit has functions of saving the data retained in the first circuit in the first period and retaining the data saved from the first circuit in a second period during which application of the power supply voltage is stopped. The third circuit has functions of saving the data retained in the second circuit in the second period and retaining the data saved from the second circuit in a third period during which application of the power supply voltage is stopped. The second circuit is capable of being written with the data for a shorter time than the third circuit. The third circuit is capable of maintaining the data for a longer time than the second circuit.

13 Claims, 9 Drawing Sheets

(56) References Cited

U.S. PATENT DOCUMENTS

| | | |
|---|---|---|
| 6,727,522 B1 | 4/2004 | Kawasaki et al. |
| 6,741,489 B2 | 5/2004 | Takasu et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,314,637 B2 | 11/2012 | Kato et al. |
| 8,362,538 B2 | 1/2013 | Koyama et al. |
| 8,410,838 B2 | 4/2013 | Kato et al. |
| 8,432,187 B2 | 4/2013 | Kato et al. |
| 8,575,985 B2 | 11/2013 | Ohmaru et al. |
| 8,593,856 B2 | 11/2013 | Koyama et al. |
| 8,618,586 B2 | 12/2013 | Koyama et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2012/0257440 A1* | 10/2012 | Takemura ............... 365/149 |
| 2012/0262982 A1* | 10/2012 | Takemura ............... 365/149 |
| 2012/0287701 A1* | 11/2012 | Takemura ............... 365/149 |
| 2013/0057315 A1 | 3/2013 | Kato et al. |
| 2013/0083588 A1* | 4/2013 | Takemura ............... 365/149 |
| 2013/0222033 A1 | 8/2013 | Kato et al. |
| 2013/0234757 A1 | 9/2013 | Kato et al. |
| 2014/0204696 A1 | 7/2014 | Kato et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2003-152506 A | 5/2003 |
| JP | 2004-103957 A | 4/2004 |
| JP | 2004-273614 A | 9/2004 |
| JP | 2004-273732 A | 9/2004 |
| WO | WO-2004/114391 | 12/2004 |

OTHER PUBLICATIONS

Asakuma.N et al., "Crystallization and Reduction of Sol-Gel-Derived Zinc Oxide Films by Irradiation with Ultraviolet Lamp", Journal of Sol-Gel Science and Technology, 2003, vol. 26, pp. 181-184.

Asaoka.Y et al., "29.1:Polarizer-Free Reflective LCD Combined With Ultra Low-Power Driving Technology", SID Digest '09: SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

(56) References Cited

OTHER PUBLICATIONS

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDs", Journal of the SID, 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters), 2005, vol. 87, pp. 122102-1-122102-3.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39 No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases For Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N. et al., "Spinel,YbFe2O4, and Yb2Fe3O7 Types of Structures for Compounds in the In2O3 and Sc2O3—A2O3—BO Systems [A; Fe, Ga or Al; B: Mg, Mn, Fe, Ni, Cu, or Zn] at Temperatures over 1000° C.", Journal of Solid State Chemistry, 1985, vol. 60, pp. 382-384.

Kimizuka.N. et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06 : Proceedings of the 13th International Display Workships, Dec. 7, 2006, pp. 663-666.

Lee.J et al., "World'S Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1961, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", JPN. J. Appl. Phys. (Japanese Journal of Applied Physics) , 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

(56) References Cited

OTHER PUBLICATIONS

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 in. QVGA AMOLED Display Using In—Ga—Zn—Oxide TFTs With a Novel Passivation Layer", SID Digest '09 : SID International Symposium Digest of Technical Papers, May 31, 2009, pp. 284-287.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philisophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3 pp. 1811-1816.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Park.J et al., "Amorphous Indium—Gallium—Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium—Gallium—Zinc Oxide Semiconductor Upon Exposure to Water", Appl. Phys. Lett. (Applied Physics Letters) , 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , June 26, 2007, vol. 90, No. 26, pp. 262106-1-262106-3.

Park.S et al., "Challenge to Future Displays: Transparent AM-OLED Driven by Peald Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Sakata.J et al., "Development of 4.0-In. AMOLED Display With Driver Circuit Using Amorphuse In—Ga—Zn—Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

* cited by examiner

NORMALLY-OFF, POWER-GATED MEMORY CIRCUIT WITH TWO DATA RETENTION STAGES FOR REDUCING OVERHEAD POWER

BACKGROUND OF THE INVENTION

1. Field of the Invention

One embodiment of the invention disclosed in this specification relates to a semiconductor device, a method for driving a semiconductor device, or a method for manufacturing a semiconductor device.

2. Description of the Related Art

Semiconductor elements in signal processing circuits such as central processing units (CPUs) have been downsized to increase operation speed and integration degree, and now transistors with a channel length of approximately 30 nm are manufactured. On the other hand, downsizing semiconductor elements leads to an increase in power consumption (leakage power) due to leakage current of transistors in CPUs. Specifically, most of the power consumption of conventional CPUs has been power consumed at the time of arithmetic operations (operating power), while leakage power accounts for at least 10% of the power consumption of CPUs in recent years.

The number of CPU cores in existing processors is significantly increased to improve computational performance and efficiency. However, when leakage power is increased as above in multi-core systems and many-core systems, power is consumed also in an unused CPU core; thus, it is difficult to construct a system with high power efficiency. In order to reduce power consumed in an unused CPU core, there has been suggested a method of stopping the supply of power with the use of a state retention register (i.e., power gating or normally-off computing). Specifically, a technique combined with a nonvolatile state retention register attracts attention (Non-Patent Document 1).

In a normally-off computer, the supply of power is stopped at short intervals, so that a memory element used for a state retention register needs to operate at high speed. For example, flash memory, which is nonvolatile memory, does not fill the need for high-speed performance, and its write cycles are inadequate for use as a state retention register.

In view of the above, there has been suggested a memory device in which a nonvolatile memory element that can operate at higher speed and has a larger number of write cycles than flash memory is provided in addition to a volatile memory element (Patent Document 1).

Patent Document 1 discloses an electronic circuit that includes a volatile data retention circuit using an inverter and a ferroelectric capacitor and can hold data by storing the data in the ferroelectric capacitor even when the supply of power is stopped.

REFERENCE

Patent Document 1: Japanese Published Patent Application No. 2003-152506

Non-Patent Document 1: Koji Ando, "FUKIHATSUSEI JIKIMEMORI" [Nonvolatile Magnetic Memory], *FED Review*, vol. 1, No. 14, 14 Mar. 2002.

SUMMARY OF THE INVENTION

In a normally-off computer, a short period of stopping the supply of power for power gating is likely to increase power consumption of a CPU when a break even time (BET) is long. Note that BET is a period of stopping the supply of power to equalize overhead power including power consumed by data saving and restoration and power that can be cut by stopping the supply of power. Thus, in order to further reduce power consumption more aggressively than ever before, it is important to further reduce power consumed by data saving and restoration. Note that overhead power is power involved in processing that is needed indirectly or additionally to perform any other processing.

Further, in the normally-off computer, if overhead time including time required for data saving and restoration in power gating is not short, it is difficult to stop the supply of power in a period during which the CPU does not operate. As the overhead time is shorter and the BET is shorter, the supply of power can be stopped even for a shorter time during which the CPU does not operate, so that power gating with fine time granularity is achieved. Note that overhead time is the time it takes to implement processing that is needed indirectly or additionally to perform any other processing.

In view of the foregoing technical background, an object of one embodiment of the present invention is to provide a semiconductor device capable of reducing overhead power. Another object of one embodiment of the present invention is to provide a semiconductor device capable of reducing overhead time. Another object of one embodiment of the present invention is to provide a device achieving lower power consumption by using one of the semiconductor devices.

In order to achieve at least one of the above objects, one embodiment of the present invention employs any of the following structures. Specifically, a semiconductor device of one embodiment of the present invention includes a first circuit, a second circuit, a third circuit, and a fourth circuit. The first circuit has a function of retaining data in a first period during which a power supply voltage is supplied. The second circuit has functions of saving the data retained in the first circuit in the first period and retaining the data saved from the first circuit in a second period during which supply of the power supply voltage is stopped. The third circuit has functions of saving the data retained in the second circuit in the second period and retaining the data saved from the second circuit in a third period during which supply of the power supply voltage is stopped. The second circuit is capable of being written with the data for a shorter time than the third circuit. The third circuit is capable of retaining the data for a longer time than the second circuit. The fourth circuit has a function of reading the data retained in the second circuit or the third circuit in a fourth period during which the power supply voltage is supplied.

A semiconductor device of another embodiment of the present invention includes a first circuit, a second circuit, a third circuit, and a fourth circuit. The first circuit has a function of retaining data in a first period during which a power supply voltage is supplied. The second circuit has functions of saving the data retained in the first circuit in the first period and retaining the data saved from the first circuit in a second period during which supply of the power supply voltage is stopped. The third circuit has functions of saving the data retained in the second circuit in the second period and retaining the data saved from the second circuit in a third period during which supply of the power supply voltage is stopped. The second circuit is capable of being written with the data for a shorter time than the third circuit. The third circuit is capable of retaining the data for a longer time than the second circuit. When a period during which supply of the power supply voltage is stopped is shorter than the second period, the data is restored from the second circuit to the first circuit through the fourth circuit in a fourth period during which the power supply voltage is supplied. When the period during which supply of the power supply voltage is stopped is longer than the second period, the data is restored from the third circuit to the first circuit through the fourth circuit in the fourth period.

In the semiconductor device of one embodiment of the present invention, the second circuit includes a first transistor containing crystalline silicon for a channel formation region, and a first capacitor charged and discharged through the first transistor in accordance with the data. The third circuit includes a second transistor containing an oxide semiconductor for a channel formation region, and a second capacitor charged and discharged through the second transistor in accordance with charge held in the first capacitor.

Note that the terms "source" and "drain" of a transistor interchange with each other depending on the polarity of the transistor or levels of potentials applied to the electrodes. In general, in an n-channel transistor, an electrode to which a lower potential is applied is called a source, and an electrode to which a higher potential is applied is called a drain. In a p-channel transistor, an electrode to which a lower potential is applied is called a drain, and an electrode to which a higher potential is applied is called a source. In this specification, although connection relation of the transistor is sometimes described assuming that the source and the drain are fixed for convenience, actually, the names of the source and the drain interchange with each other depending on the relation of the potentials. Accordingly, in this specification, a source and a drain are not particularly specified and are sometimes referred to as a first electrode (or a first terminal) and a second electrode (or a second terminal). For example, when the first electrode is a source, the second electrode refers to a drain, whereas when the first electrode is a drain, the second electrode refers to a source.

Note that the expression "A and B are connected" in this specification includes the case where A and B are electrically connected (i.e., A and B are connected through another element or another circuit) and the case where A and B are directly connected (i.e., A and B are connected without another element or another circuit placed therebetween). In addition, the state of being "electrically connected" can be regarded as a state where current, voltage, or potential can be supplied or transmitted, and therefore also includes a state of indirect connection through a circuit element such as a wiring, a resistor, a diode, or a transistor in which current, voltage, or potential can be supplied or transmitted.

Terms such as first, second, third, to N-th (N is a natural number) used in this specification are used only for preventing confusion between components, and thus do not limit numbers. For example, a first transistor in this specification can alternatively be referred to as a second transistor, a third transistor, or the like as long as it is not confused with another component.

According to one embodiment of the present invention, it is possible to provide a semiconductor device capable of reducing overhead power, a semiconductor device capable of reducing overhead time, or a device achieving lower power consumption by using one of the semiconductor devices.

BRIEF DESCRIPTION OF THE DRAWINGS

In the accompanying drawings.

DETAILED DESCRIPTION OF THE INVENTION

Figure 1:
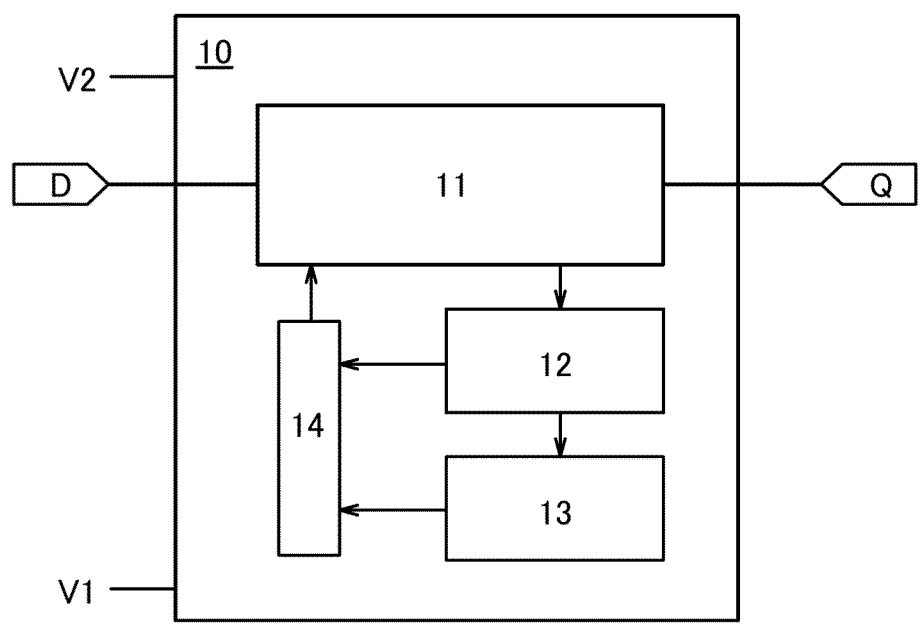
FIG. 1 illustrates a structure of a semiconductor device.

Embodiments of the present invention will be described in detail with reference to the accompanying drawings. Note that the present invention is not limited to the description below, and it is easily understood by those skilled in the art that modes and details can be modified in various ways without departing from the spirit and scope of the present invention. Therefore, the present invention should not be construed as being limited to the description of the embodiments. Note that in the embodiments of the present invention to be described below, the same reference numerals are used to denote the same components in different drawings.

An object of one embodiment of the present invention is not limited to those described above, and an object derived from the contents of the embodiments described below can be an object of one embodiment of the present invention. In one embodiment of the present invention, at least one object needs to be achieved.

In one embodiment of the present invention, an object other than the above objects, effect, and a novel feature will be apparent from the description of the specification and the drawings.

The embodiments described below can be implemented by being combined with any of the other embodiments described in this specification unless otherwise mentioned.

Embodiment 1

FIG. 1 illustrates an example of the structure of a semiconductor device in one embodiment of the present invention. A semiconductor device 10 illustrated in FIG. 1 includes a first memory circuit 11 (first circuit), a second memory circuit 12 (second circuit), a third memory circuit 13 (third circuit), and a read circuit 14 (fourth circuit).

As a power supply voltage, a potential difference between a potential V1 and a potential V2 is supplied to the semiconductor device 10. One of the potential V1 and the potential V2 is high, and the other is low. The following shows an example of the structure of a semiconductor device in one embodiment of the present invention when the potential V1 is low and the potential V2 is high.

The first memory circuit 11 has a function of retaining data when a signal D including the data is input in a period during which the power supply voltage is supplied to the semiconductor device 10. The first memory circuit 11 outputs a signal Q including the retained data in the period during which the power supply voltage is supplied to the semiconductor device 10. On the other hand, the first memory circuit 11 cannot retain data in a period during which the power supply voltage is not supplied to the semiconductor device 10. That is, the first memory circuit 11 can be called a volatile memory circuit.

The second memory circuit 12 has a function of reading the data retained in the first memory circuit 11 to save the data in the period during which the power supply voltage is supplied to the semiconductor device 10. Specifically, the second memory circuit 12 includes at least a capacitor and a transistor for controlling supply, retention, or release of charge in the capacitor. Charge is supplied to the capacitor through the transistor in the on state in accordance with a potential corresponding to the data held in the first memory circuit 11, whereby the data retained in the first memory circuit 11 is saved in the second memory circuit 12.

Further, the second memory circuit 12 has a function of retaining the saved data in the period during which the power supply voltage is not supplied to the semiconductor device 10. Specifically, the transistor included in the second memory circuit 12 is turned off and the charge in the capacitor is kept, whereby the saved data is retained.

Here, a period during which data is retained in the second memory circuit 12 while the power supply voltage is not supplied to the semiconductor device 10 is determined mainly by the off-state current of the transistor and the capacitance of the capacitor in the second memory circuit 12. Turning off the transistor in the second memory circuit 12 enables data retention in a period determined by off-state current of the transistor and capacitance of the capacitor even while the power supply voltage is not supplied to the semiconductor device 10.

Note that unless otherwise specified, in this specification, off-state current of an n-channel transistor is current that flows between a source and a drain when the potential of the drain is higher than that of the source or a gate while the potential of the gate is 0 V or lower with the potential of the source used as a reference. Alternatively, in this specification, off-state current of a p-channel transistor is current that flows between a source and a drain when the potential of the drain is lower than that of the source or a gate while the potential of the gate is 0 V or higher with the potential of the source used as a reference.

The third memory circuit 13 has a function of reading the data retained in the second memory circuit 12 to save the data in the period during which the power supply voltage is not supplied to the semiconductor device 10. Specifically, the third memory circuit 13 includes at least a capacitor and a transistor for controlling supply, retention, or release of charge in the capacitor. The capacitor is charged or discharged through the transistor in accordance with a potential corresponding to the data retained in the second memory circuit 12, whereby the data retained in the second memory circuit 12 is saved in the third memory circuit 13.

Here, in one embodiment of the present invention, the data read time of the second memory circuit 12 is preferably shorter than that of the third memory circuit 13. As a specific example for achieving this, when both the second memory circuit 12 and the third memory circuit 13 include a transistor, the field-effect mobility of the transistor in the second memory circuit 12 is higher than that of the transistor in the third memory circuit 13. Specifically, the transistor in the second memory circuit 12 can be a transistor including crystalline silicon (preferably polycrystalline silicon, more preferably single crystal silicon) in a channel formation region, whereas the transistor in the third memory circuit 13 can be a transistor including an oxide semiconductor (preferably oxide containing In, Ga, and Zn) in a channel formation region.

As another specific example for making the data read time of the second memory circuit 12 shorter than that of the third memory circuit 13, when both the second memory circuit 12 and the third memory circuit 13 include a capacitor, it is possible to employ a structure in which the capacitance of the capacitor in the second memory circuit 12 is smaller than that of the capacitor in the third memory circuit 13.

By employing these structures, the second memory circuit 12 can read data held in the first memory circuit 11 at high speed in the period during which the power supply voltage is supplied to the semiconductor device 10; thus, overhead power can be easily reduced.

Although the use of the transistor including crystalline silicon in a channel formation region for the second memory circuit 12 contributes to high-speed reading of data retained in the first memory circuit 11, the off-state current of such a transistor is relatively high. Thus, if data stored in the first memory circuit 11 is saved only by the second memory circuit 12, the data cannot be retained for a long time; thus, the retention time of the second memory circuit 12 is a limiting factor even when the quiescent time of a semiconductor device including the semiconductor device 10 is long. Consequently, a period during which the supply of the power supply voltage to the first memory circuit 11 is stopped cannot be made longer.

In view of the above, the semiconductor device 10 of one embodiment of the present invention includes the third memory circuit 13 in addition to the second memory circuit 12. It is preferable that the third memory circuit 13 can retain data for a longer time than the second memory circuit 12. As a specific example for achieving this, when both the second memory circuit 12 and the third memory circuit 13 include a transistor, the off-state current of the transistor in the second memory circuit 12 is sufficiently lower than that of the transistor in the third memory circuit 13. Specifically, the transistor in the second memory circuit 12 can be a transistor including crystalline silicon in a channel formation region, whereas the transistor in the third memory circuit 13 can be a transistor including an oxide semiconductor (preferably oxide containing In, Ga, and Zn) in a channel formation region.

A transistor in which a channel formation region is formed in a film of a semiconductor having a wider bandgap and lower intrinsic carrier density than silicon has extremely low off-state current and thus is preferably used in the third memory circuit 13. Such a semiconductor can be, for example, an oxide semiconductor whose bandgap is two or more times that of silicon. The off-state current of a transistor containing such an oxide semiconductor can be much lower than that of a transistor including crystalline silicon in a channel formation region. Thus, the use of a transistor including an oxide semiconductor in a channel formation region in the third memory circuit 13 can prevent leakage of charge held in the capacitor of the third memory circuit 13. In the period during which the power supply voltage is not supplied to the semiconductor device 10, the third memory circuit 13 can retain the saved data for a longer time than the second memory circuit 12.

The capacitance of the capacitor included in the third memory circuit 13 is preferably larger than that of the capacitor included in the second memory circuit 12, in which case the third memory circuit 13 can retain the saved data for a longer time than the second memory circuit 12 in the period during which the power supply voltage is not supplied to the semiconductor device 10.

The read circuit 14 has a function of reading data stored in the second memory circuit 12 or the third memory circuit 13, in the period during which the power supply voltage is supplied to the semiconductor device 10.

As described above, in the semiconductor device of one embodiment of the present invention, the second memory circuit 12 to which data needs to be saved from the first memory circuit 11 within a period during which the power supply voltage is supplied to the semiconductor device 10 employs a structure capable of reading data at high speed. In addition, the third memory circuit 13 that can save data from the second memory circuit 12 in a period during which the supply of the power supply voltage is stopped (a period during which the power supply voltage is not supplied) has a function of retaining data for a long time to be prepared for long-term data retention. Such a structure makes it possible to minimize the time for saving data in a period during which the power supply voltage is supplied to the semiconductor device 10. Moreover, when long-term data retention is necessary, data can be saved while (instead of before) the supply of the power supply voltage is stopped. Thus, overhead power can be minimized while long-term data retention is performed. Further, a device using the semiconductor device of one embodiment of the present invention can implement power gating with fine time granularity, so that power consumption can be effectively reduced.

Embodiment 2

Figure 2:
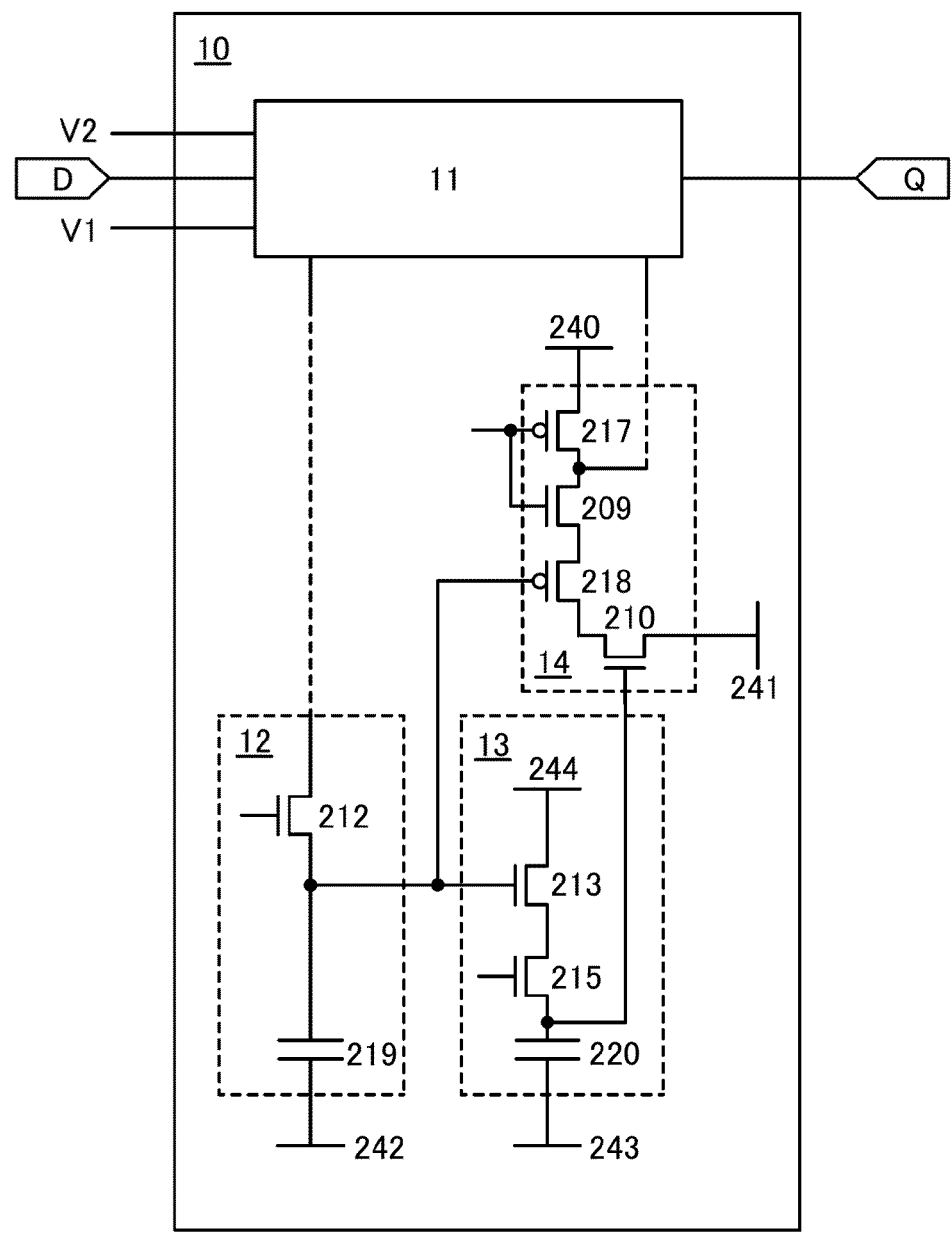
FIG. 2 illustrates a structure of a semiconductor device.

In this embodiment, an example of a specific structure of the semiconductor device 10 of FIG. 1 in Embodiment 1 will be described with reference to FIG. 2. In the semiconductor device 10 illustrated in FIG. 2, the second memory circuit 12 includes a transistor 212 and a capacitor 219; the third memory circuit 13 includes a transistor 213, a transistor 215, and a capacitor 220; and the read circuit 14 includes a transistor 210, a transistor 218, a transistor 209, and a transistor 217. Note that FIG. 2 shows an example where the transistor 209, the transistor 210, the transistor 212, the transistor 213, and the transistor 215 are each an n-channel transistor and the transistor 217 and the transistor 218 are each a p-channel transistor.

The transistor 212 has a function of charging and discharging the capacitor 219 in accordance with data retained in the first memory circuit 11. The transistor 212 is preferably capable of charging and discharging the capacitor 219 at high speed in accordance with data retained in the first memory circuit 11. Specifically, the transistor 212 preferably contains crystalline silicon (preferably polycrystalline silicon, more preferably single crystal silicon) in a channel formation region.

The on/off state of the transistor 213 is determined in accordance with the charge held in the capacitor 219. The transistor 215 has a function of charging and discharging the capacitor 220 in accordance with the potential of a wiring 244 when the transistor 213 is on. It is preferable that the off-state current of the transistor 215 be extremely low. Specifically, the transistor 215 preferably contains an oxide semiconductor (preferably oxide containing In, Ga, and Zn) in a channel formation region.

Specific connection relations between the elements are as follows. One of a source and a drain of the transistor 212 is connected to the first memory circuit 11. The other of the source and the drain of the transistor 212 is connected to one electrode of the capacitor 219, a gate of the transistor 213, and a gate of the transistor 218. The other electrode of the capacitor 219 is connected to a wiring 242. One of a source and a drain of the transistor 213 is connected to the wiring 244. The other of the source and the drain of the transistor 213 is connected to one of a source and a drain of the transistor 215. The other of the source and the drain of the transistor 215 is connected to one electrode of the capacitor 220 and a gate of the transistor 210. The other electrode of the capacitor 220 is connected to a wiring 243. One of a source and a drain of the transistor 210 is connected to a wiring 241. The other of the source and the drain of the transistor 210 is connected to one of a source and a drain of the transistor 218. The other of the source and the drain of the transistor 218 is connected to one of a source and a drain of the transistor 209. The other of the source and the drain of the transistor 209 is connected to one of a source and a drain of the transistor 217 and the first memory circuit 11. The other of the source and the drain of the transistor 217 is connected to a wiring 240. Although a gate of the transistor 209 is connected to a gate of the transistor 217 in FIG. 2, it is not necessarily connected to the gate of the transistor 217.

Note that FIG. 2 shows an example where the third memory circuit 13 and the read circuit 14 are connected to each other and the second memory circuit 12 and the read circuit 14 are connected to each other; however, one embodiment of the present invention is not limited to this structure. That is, the read circuit 14 is not necessarily connected to the second memory circuit 12 as long as it is connected at least to the third memory circuit 13. However, the structure where the read circuit 14 is connected to the second memory circuit 12 is preferable for power gating with fine time granularity because data stored in the second memory circuit 12 can be read by the read circuit 14 and supplied to the first memory circuit 11.

Embodiment 3

In this embodiment, an example of a more specific structure of the semiconductor device 10 described in Embodiment 1 or 2 will be described with reference to FIG. 3.

Figure 3:
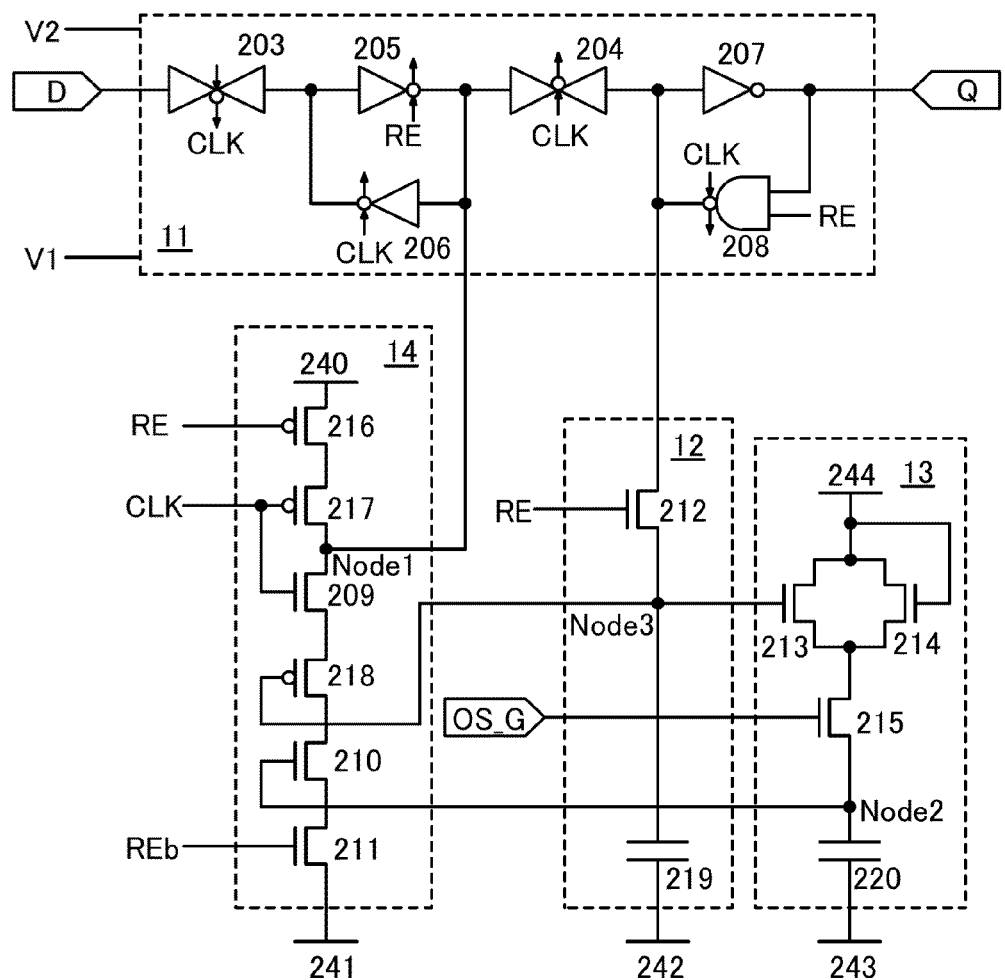
FIG. 3 illustrates a structure of a semiconductor device.

FIG. 3 illustrates an example of a circuit diagram of the semiconductor device 10.

The semiconductor device 10 includes the first memory circuit 11, the second memory circuit 12, the third memory circuit 13, and the read circuit 14. The first memory circuit 11 has a function of storing data in a period during which a potential difference between the low-level potential V1 and the high-level potential V2 is supplied as the power supply voltage.

The first memory circuit 11 includes a transmission gate 203, a transmission gate 204, an inverter 205, an inverter 206, an inverter 207, and a NAND gate 208. Note that the first memory circuit 11 may also include another circuit element such as a diode, a resistor, or an inductor as needed.

The operating frequency (corresponding to the inverse of data delay time) of the first memory circuit 11 depends on the electrical characteristics of elements included in the transmission gates 203 and 204, the inverters 205 to 207, and the NAND gate 208. Thus, in order to operate the first memory circuit 11 at high frequency in a normal operation period (i.e., a period during which power gating is not performed), transistors including crystalline silicon (preferably polycrystalline silicon, more preferably single crystal silicon) in a channel formation region are preferably used as the elements included in the transmission gates 203 and 204, the inverters 205 to 207, and the NAND gate 208. In other words, it is preferable that a transistor including amorphous silicon or an oxide semiconductor in a channel formation region be not used as any of the elements included in the transmission gates 203 and 204, the inverters 205 to 207, and the NAND gate 208. In this case, the semiconductor device 10 can operate at a frequency equivalent to (e.g., 0.5 to 1.0 times) the operating frequency of a semiconductor device that does not include the second memory circuit 12 or the third memory circuit 13 and is composed only of the first memory circuits 11.

The transmission gate 203 determines whether to output a signal in accordance with a signal CLK. Specifically, the transmission gate 203 has a function of supplying a signal D including data to an input terminal of the inverter 205 when the signal CLK is low. Further, the transmission gate 203 has high impedance and stops the supply of the signal D to the input terminal of the inverter 205 when the signal CLK is high.

The inverter 205 determines whether to output a signal in accordance with a signal RE. Specifically, the inverter 205 has a function of inverting the polarity of a potential of a signal supplied to the input terminal and supplying the signal to an input terminal of the transmission gate 204 and an input terminal of the inverter 206 when the signal RE is high. Moreover, the inverter 205 has high impedance and stops the supply of the signal to the input terminal of the transmission gate 204 and the input terminal of the inverter 206 when the signal RE is low.

The inverter 206 determines whether to output a signal in accordance with the signal CLK. Specifically, the inverter 206 has a function of inverting the polarity of a potential of a signal supplied to its input terminal and supplying the signal to the input terminal of the inverter 205 when the signal CLK is high. Moreover, the inverter 206 has high impedance and stops the supply of the signal to the input terminal of the inverter 205 when the signal CLK is low.

The transmission gate 204 determines whether to output a signal in accordance with the signal CLK. Specifically, the transmission gate 204 has a function of supplying a signal supplied to its input terminal to an input terminal of the inverter 207 when the signal CLK is high. Furthermore, the transmission gate 204 has high impedance and stops the supply of the signal to the input terminal of the inverter 207 when the signal CLK is low.

The inverter 207 has a function of supplying the signal Q to a first input terminal of the NAND gate 208. The signal Q is obtained by inverting the polarity of the potential supplied to the input terminal of the inverter 207.

The NAND gate 208 is a two-input NAND gate and determines whether to output a signal in accordance with the signal CLK. A second input terminal of the NAND gate 208 is supplied with the signal RE. Specifically, the NAND gate 208 has a function of supplying a signal to the input terminal of the inverter 207 in accordance with signals input to first and second input terminals when the signal CLK is low. In addition, the NAND gate 208 has high impedance and stops the output of a signal regardless of the signals input to the first and second input terminals when the signal CLK is high.

The second memory circuit 12 includes the n-channel transistor 212 and the capacitor 219. The third memory circuit 13 includes n-channel transistors 213, 214, and 215 and the capacitor 220. The read circuit 14 includes n-channel transistors 209, 210, and 211 and p-channel transistors 216, 217, and 218. Note that the second memory circuit 12, the third memory circuit 13, and the read circuit 14 may also include another circuit element such as a diode, a resistor, or an inductor as needed. In order for the read circuit 14 to read data at high speed, the n-channel transistors 209 to 211 and the p-channel transistors 216 to 218 preferably contain crystalline silicon (preferably polycrystalline silicon, more preferably single crystal silicon) in a channel formation region.

The transistors 216, 217, 209, 218, 210, and 211 are connected in series in this order between the wiring 240 supplied with the potential V2 and the wiring 241 supplied with the potential V1. Specifically, one of a source and a drain of the transistor 216 is connected to the wiring 240, and the other of the source and the drain of the transistor 216 is connected to one of a source and a drain of the transistor 217. The other of the source and the drain of the transistor 217 is connected to one of a source and a drain of the transistor 209. The other of the source and the drain of the transistor 209 is connected to one of a source and a drain of the transistor 218. The other of the source and the drain of the transistor 218 is connected to one of a source and a drain of the transistor 210. The other of the source and the drain of the transistor 210 is connected to one of a source and a drain of the transistor 211. The other of the source and the drain of the transistor 211 is connected to the wiring 241.

A gate of the transistor 216 and a gate of the transistor 212 are supplied with the signal RE. A gate of the transistor 211 is supplied with a signal REb that is obtained by inverting the polarity of the potential of the signal RE. A gate of the transistor 217 and a gate of the transistor 209 are supplied with the signal CLK. A gate of the transistor 215 is supplied with a signal OS_G.

A gate of the transistor 218 is connected to one of the source and the drain of the transistor 212, the gate of the transistor 213, and one electrode of the capacitor 219. The other electrode of the capacitor 219 is connected to the wiring 242 supplied with the potential V1.

The gate of the transistor 210 is connected to one of the source and the drain of the transistor 215 and one electrode of the capacitor 220. The other electrode of the capacitor 220 is connected to the wiring 243 supplied with the potential V1.

Note that the wiring 240 and the wiring 244 may be connected to each other. In addition, the wiring 241, the wiring 242, and the wiring 243 may be connected to each other.

One of the source and the drain of the transistor 213 is connected to the wiring 244 supplied with the potential V2, one of a source and a drain of the transistor 214, and a gate of the transistor 214. The other of the source and the drain of the transistor 213 is connected to the other of the source and the drain of the transistor 215 and the other of the source and the drain of the transistor 214.

An output terminal of the inverter 205, the input terminal of the transmission gate 204, and the input terminal of the inverter 206 that are included in the first memory circuit 11 are connected to the other of the source and the drain of the transistor 217 and the one of the source and the drain of the transistor 209 that are included in the read circuit 14.

The output terminal of the transmission gate 204, the input terminal of the inverter 207, and an output terminal of the NAND 208 that are included in the first memory circuit 11 are connected to the other of the source and the drain of the transistor 212 included in the second memory circuit 12.

In one embodiment of the present invention, the use of a transistor with ultra-low off-state current as the transistor 215 leads to a reduction in the amount of charge leaking from the capacitor 220, thereby ensuring a long period during which data is retained in the third memory circuit 13. Specifically, the transistor 215 is preferably a transistor that contains an oxide semiconductor (preferably highly purified intrinsic or substantially highly purified intrinsic oxide semiconductor) for a channel formation region.

A transistor that contains an oxide semiconductor, which has a wider bandgap and lower intrinsic carrier density than silicon, in channel formation region has an off-state current much lower than that of a transistor that contains silicon in a channel formation region, and thus is suitable for the transistor 215. In particular, a highly purified oxide semiconductor (purified oxide semiconductor) obtained by reduction of impurities such as moisture or hydrogen which serve as electron donors (donors) and reduction of oxygen vacancies is an intrinsic (i-type) semiconductor or a substantially i-type semiconductor. For this reason, a transistor containing a highly purified intrinsic or substantially highly purified intrinsic oxide semiconductor for a channel formation region has ultra-low off-state current and high reliability. Specifically, the off-state current (standardized on the channel width) of such a transistor can be 100 zA/μm (z: SI prefix representing $10^{-21}$) or lower, preferably 100 yA/μm (y: SI prefix representing $10^{-24}$) or lower.

Embodiment 4

Figure 4:
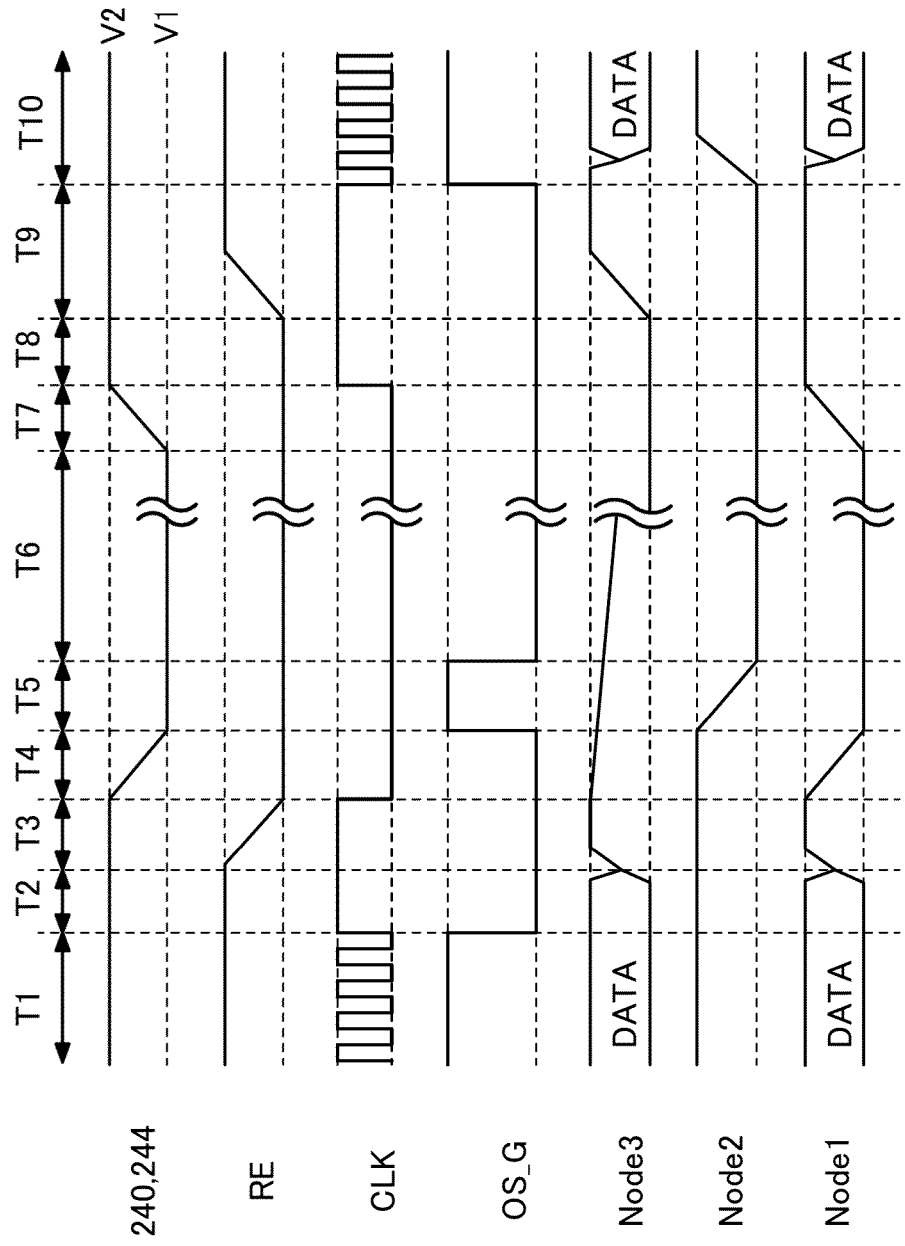
FIG. 4 is a timing chart illustrating the operation of a semiconductor device.

In this embodiment, an example of the operation of the semiconductor device 10 illustrating in FIG. 3 will be described with reference to a timing chart in FIG. 4. FIG. 4 shows waveforms of the signals (RE, CLK, and OS_G) and changes in the potentials of the wiring 240, the wiring 244, and nodes (Node1, Node2, and Node3).

First, in a period T1 to a period T3, a potential difference between the potential V1 and the potential V2 is applied to the semiconductor device 10 as the power supply voltage. Thus, the potential V1 is applied to the wirings 241 to 243, and the potential V2 is applied to the wirings 240 and 244.

In the period T1, the signal RE is high, the signal OS_G is high, and the signal CLK oscillates between a high and a low state at predetermined intervals. Accordingly, the node (Node3) connected to the other of the source and the drain of the transistor 212 and one electrode of the capacitor 219 is supplied with a potential corresponding to data written into the first memory circuit 11. The node (Node2) connected to the other of the source and the drain of the transistor 215 and one electrode of the capacitor 220 is supplied with a high-level potential through the wiring 244. As above, one of the features of this embodiment is that the high-level potential is supplied to the node (Node2) and the capacitor 220 is charged in the period T1.

In the next period T2, the signal RE is kept high; however, the signal OS_G becomes low and the signal CLK becomes high. Thus, the transmission gate 203 has high impedance and the supply of the signal D to the semiconductor device 10 is stopped, so that data that is most recently written in the period T1 is retained in the first memory circuit 11. Accordingly, Node3 is supplied with a potential corresponding to the data stored in the first memory circuit 11. Turning off the transistor 215 allows the high-level potential to be held at Node2 by the capacitor 220.

In the next period T3, the signal RE goes from high to low. The signal OS_G remains low, and the signal CLK remains high. Thus, the transistor 212 is turned off, so that the potential supplied in the period T2 is maintained at Node3 in the period T3. The timing chart of FIG. 4 shows the case where a high-level potential is kept at Node3. Turning off the transistor 215 with ultra-low off-state current allows the high-level potential to be kept at Node2.

Through the above operations in the periods T2 and T3, data retained in the first memory circuit 11 can be saved in the second memory circuit 12.

In the next period T4, the supply of the power supply voltage to the semiconductor device 10 is stopped. Thus, the potential V1 is applied to the wirings 240 to 244. The signal RE and the signal OS_G are kept low. The signal CLK becomes low. Accordingly, in the period T4, the potential corresponding to the data is kept at Node3 as in the period T3. However, even if the high-level potential is kept at Node3 at the beginning of the period T4, the potential of Node3 is decreased a little in the period T4 over time because of leakage current. Moreover, the high-level potential is kept at Node2 because the transistor 215 with ultra-low off-state current remains off.

In the next period T5, a state in which the supply of the power supply voltage to the semiconductor device 10 is stopped is kept. The signal RE and the signal CLK are kept low. The signal OS_G becomes high. Thus, the transistor 215 is turned on in the period T5, so that the potential of Node2 is determined by the on/off state of the transistor 213. For example, when the low-level potential is kept at Node3, the transistor 213 is off; thus, the high-level potential is kept at Node2. On the other hand, when the high-level potential is kept at Node3, the transistor 213 is on. Here, the wirings 240 and 244 have the potential V1 because the supply of the power supply voltage to the semiconductor device 10 is stopped; thus, the low-level potential is supplied to Node2.

In the period T5, a potential corresponding to data saved from the first memory circuit 11 is kept at Node3. Accordingly, in the period T5, data saved from the first memory circuit 11 to the second memory circuit 12 in the period T2 can be saved in the third memory circuit 13.

In the next period T6, a state in which the supply of the power supply voltage to the semiconductor device 10 is stopped is kept. The signal OS_G becomes low and the transistor 215 is turned off, so that the potential of Node2 is maintained. In the period T6, the signal RE and the signal CLK are kept low. When the high-level potential is kept at Node3 in the period T5, the potential of Node3 is reduced to a low level depending on the length of the period T6. On the other hand, when the low-level potential is kept at Node3 in the period T5, Node3 maintains the low-level potential regardless of the length of the period T6.

Then, in periods T7 to T10, the supply of the power supply voltage is restarted. Thus, the potential V1 is applied to the wirings 241 to 243, and the potential V2 is applied to the wirings 240 and 244. In the period T7, the signal RE, the signal CLK, and the signal OS_G are kept low. Thus, the transistors 216 and 217 are on, so that the potential of the wiring 240 is supplied to Node1.

In the period T8, the signal RE and the signal OS_G are kept low. The signal CLK becomes high. The potential of Node3 is low. Accordingly, the transistors 209, 218, and 211 are on and the transistor 217 is off in the period T8, so that the potential of Node1 is determined by the on/off state of the transistor 210. For example, the transistor 210 is off when the low-level potential is kept at Node2; thus, the high-level potential is kept at Node1. On the other hand, the transistor 210 is on when the high-level potential is kept at Node2; thus, the low-level potential is supplied to Node1 owing to the potential V1 of the wiring 241.

Node1 is connected to the output terminal of the inverter 205, the input terminal of the transmission gate 204, and the input terminal of the inverter 206 that are included in the first memory circuit 11. Thus, in the period T8, data saved from the second memory circuit 12 to the third memory circuit 13 in the period T5 can be read by the read circuit 14 and restored to the first memory circuit 11.

The timing chart of FIG. 4 shows the case where the high-level potential is kept at Node1 in the period T8.

Note that when the period T6 is short, it is possible that the potential of Node3 is not reduced to a low level in the period T8. In this case, since the transistor 218 is off, the high-level potential is kept at Node1 as in the case where the low-level potential is kept at Node2. Consequently, in any case, data saved from the second memory circuit 12 to the third memory circuit 13 in the period T5 can be restored to the first memory circuit 11.

In the period T9, the signal RE goes from low to high. The signal CLK remains high, and the signal OS_G remains low. Thus, in the period T9, the inverter 205 starts to supply signals to the input terminal of the transmission gate 204 and the input terminal of the inverter 206. The NAND gate 208 starts to supply a signal that is obtained by inverting the polarity of the potential supplied to the first input terminal, to the input terminal of the inverter 207. The transmission gate 204 supplies a signal to the input terminal of the inverter 207. Accordingly, in the period T9, the restored data is retained in the first memory circuit 11.

In the period T9, the transistor 212 is turned on, so that a potential corresponding to the data stored in the first memory circuit 11 is applied to Node3. The timing chart of FIG. 4 shows the case where the potential V2 (high-level potential) is applied to Node3 in the period T9.

In the next period T10, as in the period T1, the signal RE is high, the signal OS_G is high, and the signal CLK oscillates between a high and a low state at predetermined intervals. Thus, as in the period T9, Node3 is supplied with the potential corresponding to the data written into the first memory circuit 11. Node2 is supplied with the high-level potential.

Note that in the semiconductor device 10 illustrated in FIG. 3, the operation (on/off state) of the transistor 210 is determined in accordance with the potential kept by the capacitor 220 or the gate capacitance of the transistor 210, and data is read on the basis of the state of the transistor 210. Consequently, the original data can be accurately read even when a potential maintained by the capacitor 220 or the gate capacitance of the transistor 210 fluctuates to some degree.

In addition, in the semiconductor device 10 shown in FIG. 3, data in the first memory circuit 11 is saved once in the second memory circuit 12 and then the data is saved from the second memory circuit 12 to the third memory circuit 13. Thus, after the supply of the power supply voltage to the semiconductor device 10 is stopped in the period T4, data can be saved in the third memory circuit 13 in the period T5. As a result, overhead power required for data saving can be reduced.

In the semiconductor device 10 in FIG. 3, the on/off state of the transistor 212 is selected (switched) using the signal RE; alternatively, the switching of the transistor 212 may be controlled by a signal other than the signal RE and the transistor 212 may be off in the periods T1 and T10. With this structure, in the periods T1 and T10, the capacitor 219 is not charged or discharged, so that the first memory circuit 11 operates at higher speed. In this case, the last data is written into the first memory circuit 11 before the supply of the power supply voltage to the semiconductor device 10 is stopped, and the switching of the transistor 212 is controlled so that data is saved from the first memory circuit 11 to the second memory circuit 12 in the period T2 or the period T3.

In the case where the switching of the transistor 212 is controlled with the signal RE, the number of signals necessary for controlling the operation of the semiconductor device 10 can be smaller than that in the case where the switching of the transistor 212 is controlled with a signal other than the signal RE.

In the read circuit 14 in the semiconductor device 10 shown in FIG. 3, the switching of the transistors 217 and 209 is controlled with the signal CLK; alternatively, the switching of the transistors 217 and 209 may be controlled with a signal other than the signal CLK. In this case, the transistors 216 and 211 are not necessarily provided in the read circuit 14; thus, the number of transistors used in the read circuit 14 is reduced.

On the other hand, in the case where the switching of the transistors 217 and 209 are controlled with the signal CLK, the number of signals necessary for controlling the operation of the semiconductor device 10 can be smaller than that in the case where the switching of the transistors 217 and 209 are controlled with a signal other than the signal CLK.

Employing the operation described in this embodiment enables a device including the semiconductor device 10 to reduce overhead power consumed by data saving and restoration.

Embodiment 5

Figure 5:
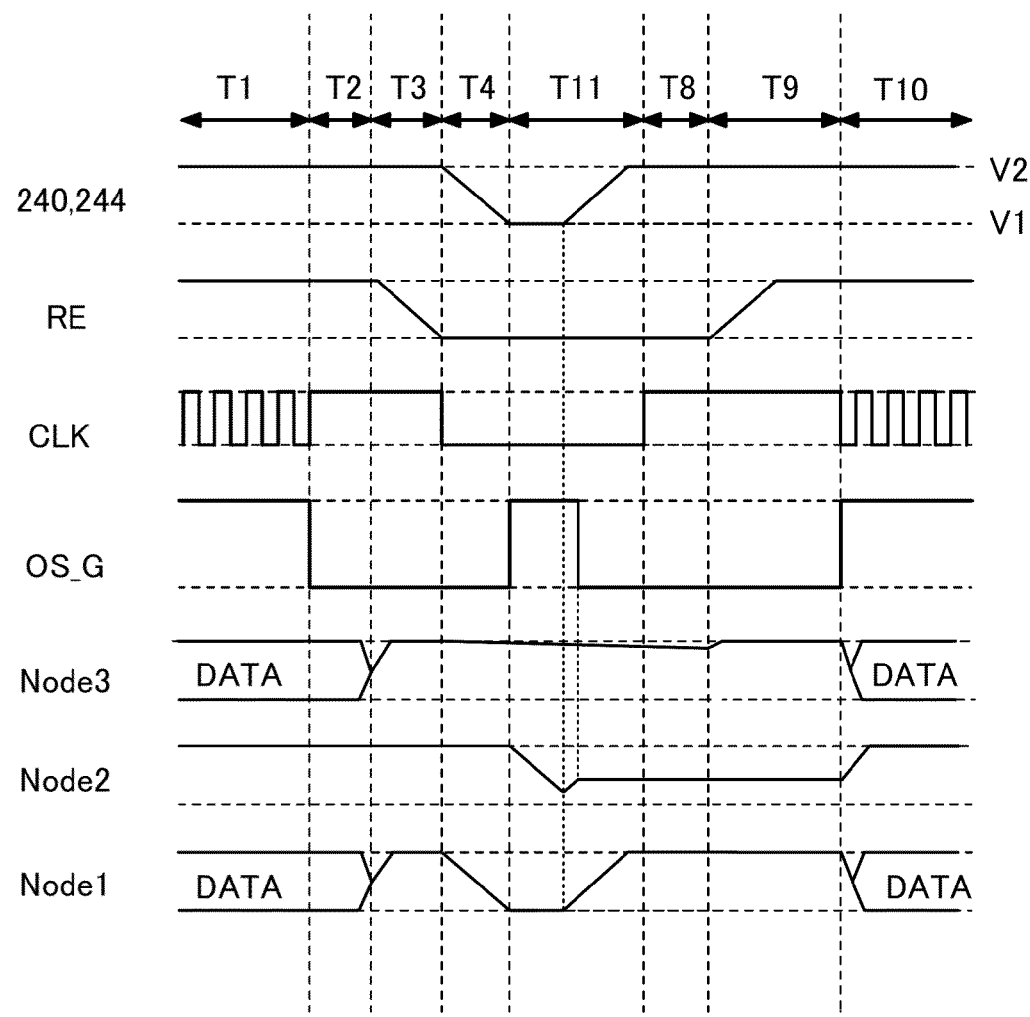
FIG. 5 is a timing chart illustrating the operation of a semiconductor device.

In this embodiment, an example of the operation of the semiconductor device 10 illustrating in FIG. 3 will be described with reference to a timing chart in FIG. 5. That is, an operation example of the semiconductor device 10 different from that in Embodiment 4 will be described. Like FIG. 4, FIG. 5 shows waveforms of the signals (RE, CLK, and OS_G) and changes in the potentials of the wiring 240, the wiring 244, and the nodes (Node1, Node2, and Node3).

In the operation example described in Embodiment 4, data stored in the third memory circuit 13 is used to restore data to the first memory circuit 11 regardless of the length of a period during which the power supply voltage is not supplied (also referred to as a period without power supply). On the other hand, in the operation example of this embodiment, in order to restore data to the first memory circuit 11, data stored in the third memory circuit 13 is used when the period without power supply is long, whereas data stored in the second memory circuit 12 is used when the period without power supply is short.

Here, a reference for determining whether the period without power supply is long or short can be set as appropriate. For example, whether the period without power supply is long or short can be set using any of the following references: the time it takes to save data from the second memory circuit 12 to the third memory circuit 13; predetermined counts of the clock signal (e.g., 10000, 100, 10, or 1 counts); and a maximum period during which the second memory circuit 12 can store data long enough to restore the original correct data from the second memory circuit 12 to the first memory circuit 11.

When the period without power supply is long, the operation described in Embodiment 4 is performed; therefore, the description is omitted here.

The operation example in which the period without power supply is short is described.

First, in a period T1 to a period T3, a potential difference between the potential V1 and the potential V2 is applied to the semiconductor device 10 as the power supply voltage. Thus, the potential V1 is applied to the wirings 241 to 243, and the potential V2 is applied to the wirings 240 and 244.

The period T1 corresponds to a normal operation period (i.e., a period during which power gating is not performed). In the period T1, the signal RE is high, the signal OS_G is high, and the signal CLK oscillates between a high and a low state at predetermined intervals. Accordingly, the node (Node3) connected to the other of the source and the drain of the transistor 212 and one electrode of the capacitor 219 is supplied with a potential corresponding to data written into the first memory circuit 11. The node (Node2) connected to the other of the source and the drain of the transistor 215 and one electrode of the capacitor 220 is supplied with a high-level potential through the wiring 244. As above, one of the features of this embodiment is that the high-level potential is supplied to the node (Node2) and the capacitor 220 is charged in the period T1.

In the next period T2, the signal RE is kept high; however, the signal OS_G becomes low and the signal CLK becomes high. Thus, the transmission gate 203 has high impedance and the supply of the signal D to the semiconductor device 10 is stopped, so that data that is most recently written in the period T1 is retained in the first memory circuit 11. Accordingly, Node3 is supplied with a potential corresponding to the data stored in the first memory circuit 11. The transistor 215 is turned off, whereby the high-level potential applied in the period T1 is held at Node2 by the capacitor 220.

In the next period T3, the signal RE goes from high to low. The signal OS_G remains low, and the signal CLK remains high. Thus, the transistor 212 is turned off, so that the potential supplied in the period T2 is maintained at Node3 in the period T3. The timing chart of FIG. 5 shows the case where a high-level potential is kept at Node1 and Node3. Since the off-state current of the transistor 215 is extremely low, charge hardly leaks through the transistor 215 in the off state, so that the high-level potential kept at Node2 in the period T2 is maintained in the period T3.

Through the above operations in the periods T2 and T3, data retained in the first memory circuit 11 can be saved in the second memory circuit 12.

In the next period T4, the supply of the power supply voltage to the semiconductor device 10 is stopped. The potential V1 is applied to the wirings 240 to 244. The signal RE and the signal OS_G are kept low. The signal CLK becomes low. Thus, in the period T4, the potential corresponding to the data is kept at Node3 as in the period T3. However, even if the high-level potential is kept at Node3 at the beginning of the period T3, the potential of Node3 is decreased a little in the period T4 over time because of leakage current of the transistor 212. Since the off-state current of the transistor 215 is extremely low, charge does not leak through the transistor 215 in the off state, so that the high-level potential kept at Node2 in the period T3 is maintained in the period T4.

Then, in a period T11, the signal RE and the signal CLK are kept low. The supply of the power supply voltage to the semiconductor device 10 is stopped for a predetermined period and then restarted. The signal OS_G becomes high and then goes to low. Accordingly, in the period T11, the transistors 216 and 217 are kept on after the supply of the power supply voltage is restarted; thus, the potential of the wiring 240 is supplied to Node1. Here, the wiring 240 is supplied with the potential V1, and then supplied with the potential V2 in response to restart of the supply of the power supply voltage. Thus, the potential of Node1 changes from low level (the potential V1) to high level (the potential V2) during the period T11. That is, the potential of Node1 is high at the end of the period T11.

Here, if the low-level potential is kept at Node3 in the period T11, the transistor 213 is off and the high-level potential kept at Node2 in the period T4 is maintained.

When the high-level potential is kept at Node3 in the period T11 as shown in FIG. 5, the transistor 213 is on. Here, the potential of the wiring 244 is applied to one of the source and the drain of the transistor 215 in the on state. The wiring 244 is supplied with the potential V1, and then supplied with the potential V2 in response to restart of the supply of the power supply voltage. In FIG. 5, the supply of the power supply voltage (potential V2) starts before the end of a period during which the signal OS_G is high. Thus, in the period T11, the potential of Node2 gradually decreases from the potential V2 (high level) after the transistor 215 is turned on. Next, the potential of Node2 gradually increases because the supply of the power supply voltage restarts before the potential decreases to the potential V1 (low level). Then, the transistor 215 is turned off before the potential of Node2 increases to the potential V2 (high level), that is, while the potential of Node2 is a potential V3; thus, the potential of Node2 is subsequently fixed at the potential V3. When the high-level potential is kept at Node3 in the period T11, the potential of Node2 at the end of the period T11 should be the potential V1 (low level) but becomes the potential V3, which is between the potential V1 and the potential V2, because the supply of the power supply voltage is restarted before the potential of Node2 changes from the potential V2 to the potential V1. In other words, the potential of Node2 at the end of the period T11 is not a potential based on data that is to be normally held, and data saving from the second memory circuit 12 to the third memory circuit 13 is not completed.

Note that the length of the period during which the signal OS_G is high in the period T11 of FIG. 5 is the same as that in the period T5 of FIG. 4; however, these periods are not necessarily the same in length. For example, the signal OS_G may be high in the entire period T11, in the periods T11 and T8, or in the periods T11, T8, and T9.

Next, in the period T8, the power supply voltage keeps being supplied to the semiconductor device 10, and the signal RE and the signal OS_G are kept low. The signal CLK becomes high.

If the low-level potential is maintained at Node3 in the period T11, the transistor 218 is turned on in the period T8. The transistor 210 is on because the high-level potential is maintained at Node2. The transistor 211 is on because the signal REb is high. The transistor 209 is on and the transistor 217 is off because the signal CLK is high. Accordingly, Node1 is supplied with the potential of the wiring 241 (i.e., the low-level potential) through the transistors 209, 218, 210, and 211. Thus, in the period T8, data saved in the second memory circuit 12 in the periods T2 and T3 can be read by the read circuit 14 and restored to the first memory circuit 11.

When the high-level potential is kept at Node3 in the period T11 as shown in FIG. 5, the transistor 218 is off in the period T8. The transistor 217 is also off. Thus, the potential of Node1 remains at the state at the end of the period T11 (i.e., high level). In such a manner, the potential of Node1 is fixed at high level regardless of the potential of Node2 in the period T11 when the high-level potential is maintained at Node3 in the period T11. Accordingly, in the period T8, data saved in the second memory circuit 12 in the periods T2 and T3 can be read by the read circuit 14 and restored to the first memory circuit 11.

When the high-level potential is kept at Node3 as described above, the potential of Node3 is decreased a little over time by the leakage current in a period during which the signal RE is low (i.e., in the periods T3, T4, T11, and T8). However, these periods are short enough to restore the original correct data from the second memory circuit 12 to the first memory circuit 11 and thus do not cause a problem with data restoration. In other words, if the period during which the signal RE is low is so long that a problem arises in data restoration (e.g., if the potential of Node3 goes form high to low during the period T6 as shown in FIG. 4), data can be read from the third memory circuit 13 capable of long-term data retention and transmitted to the first memory circuit 11 on the basis of the operation example in Embodiment 4.

As described above, data can be read from the second memory circuit 12 and transmitted to the first memory circuit 11 (Node1) in the period T11 even when there is not enough time to save data stored in the second memory circuit 12 to the third memory circuit 13. Thus, overhead time as well as overhead power consumed by data saving and restoration can be reduced, whereby power gating with fine time granularity can be implemented.

Here, shorter overhead time achieved by the operation described in this embodiment will be described in detail.

In the operation example described in Embodiment 4 with reference to FIG. 4, data saved from the second memory circuit 12 to the third memory circuit 13 is used to restore data to the first memory circuit 11. Thus, data saving in the third memory circuit 13 needs to be completed to restore data.

On the other hand, in the operation example described in this embodiment with reference to FIG. 5, data saved in the second memory circuit 12 is used to restore data to the first memory circuit 11. For this reason, data saving from the second memory circuit 12 to the third memory circuit 13 is not necessarily completed to restore data.

When the overhead time in the operation example of FIG. 5 is compared to that of FIG. 4, the operation in FIG. 5 obtains a shorter overhead time than that in FIG. 4 because it does not need to take into account a period for saving data from the second memory circuit 12 to the third memory circuit 13 to restore data to the first memory circuit 11.

From the reasons described above, to restore data to the first memory circuit 11, the semiconductor device 10 operates in the mode described in Embodiment 4 using FIG. 4 when a period without power supply is long, and operates in the mode described in this embodiment using FIG. 5 when a period without power supply is short. Thus, overhead time can be reduced, so that power gating with fine time granularity can be implemented.

In the period T9, the signal RE goes from low to high. The signal CLK remains high, and the signal OS_G remains low. Thus, in the period T9, the inverter 205 starts to supply signals to the input terminal of the transmission gate 204 and the input terminal of the inverter 206. The NAND gate 208 starts to supply a signal that is obtained by inverting the polarity of the potential supplied to the first input terminal, to the input terminal of the inverter 207. The transmission gate 204 supplies a signal to the input terminal of the inverter 207. Accordingly, in the period T9, the restored data is retained in the first memory circuit 11.

In the period T9, the transistor 212 is turned on, so that a potential corresponding to the data stored in the first memory circuit 11 is applied to Node3. The timing chart of FIG. 5 shows the case where the potential V2 (high-level potential) is applied to Node3 in the period T9.

The next period T10 corresponds to a normal operation period (a period during which power gating is not performed). In other words, as in the period T1, the signal RE is high, the signal OS_G is high, and the signal CLK oscillates between a high and a low state at predetermined intervals. Thus, as in the period T9, Node3 is supplied with the potential corresponding to the data written into the first memory circuit 11. Node2 is supplied with the high-level potential.

As has been described above, by performing the operation described in this embodiment, a semiconductor device including the semiconductor device 10 can reduce overhead time in addition to overhead power consumed by data saving and restoration. Consequently, power gating with fine time granularity can be implemented.

Embodiment 6

In this embodiment, examples of the structure of a semiconductor device will be described.

Figure 6A:
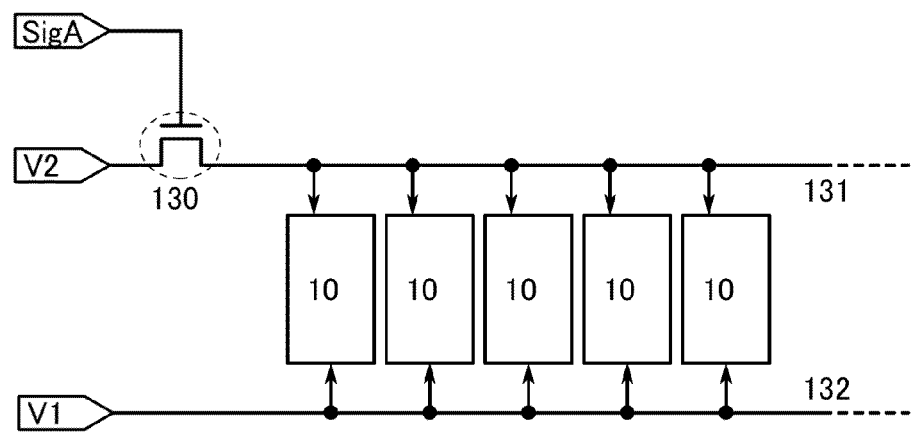
FIGS. 6A and 6B each illustrate a structure of a semiconductor device.

A semiconductor device illustrated in FIG. 6A includes a switch 130 and a plurality of semiconductor devices 10. The potential V2 applied to a wiring 131 through the switch 130 is supplied to each of the semiconductor devices 10. The potential V1 is applied to each of the semiconductor devices 10 through a wiring 132.

FIG. 6A shows an example in which a single transistor is used as the switch 130. The switching of the switch 130 is controlled by a signal SigA. By the switch 130, the supply of the potential V2 to each of the semiconductor devices 10 can be controlled.

Figure 6B:
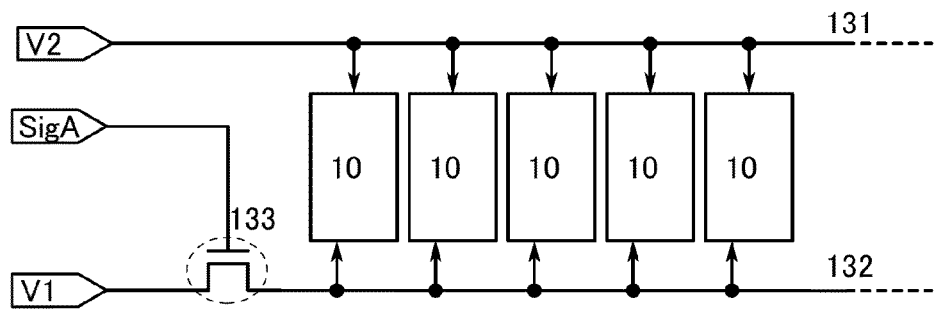

FIG. 6B illustrates another example of the structure of a semiconductor device. The semiconductor device illustrated in FIG. 6B includes a switch 133 and a plurality of semiconductor devices 10. The potential V1 applied to the wiring 132 through the switch 133 is supplied to each of the semiconductor devices 10. The potential V2 is applied to each of the semiconductor devices 10 through the wiring 131.

FIG. 6B shows an example in which a single transistor is used as the switch 133. The switching of the switch 133 is controlled by the signal SigA. By the switch 133, the supply of the potential V1 to each of the semiconductor devices 10 can be controlled.

Embodiment 7

In Embodiment 7, an example of the structure of a device including the semiconductor device in one embodiment of the present invention will be described with reference to FIG. 7.

Figure 7:
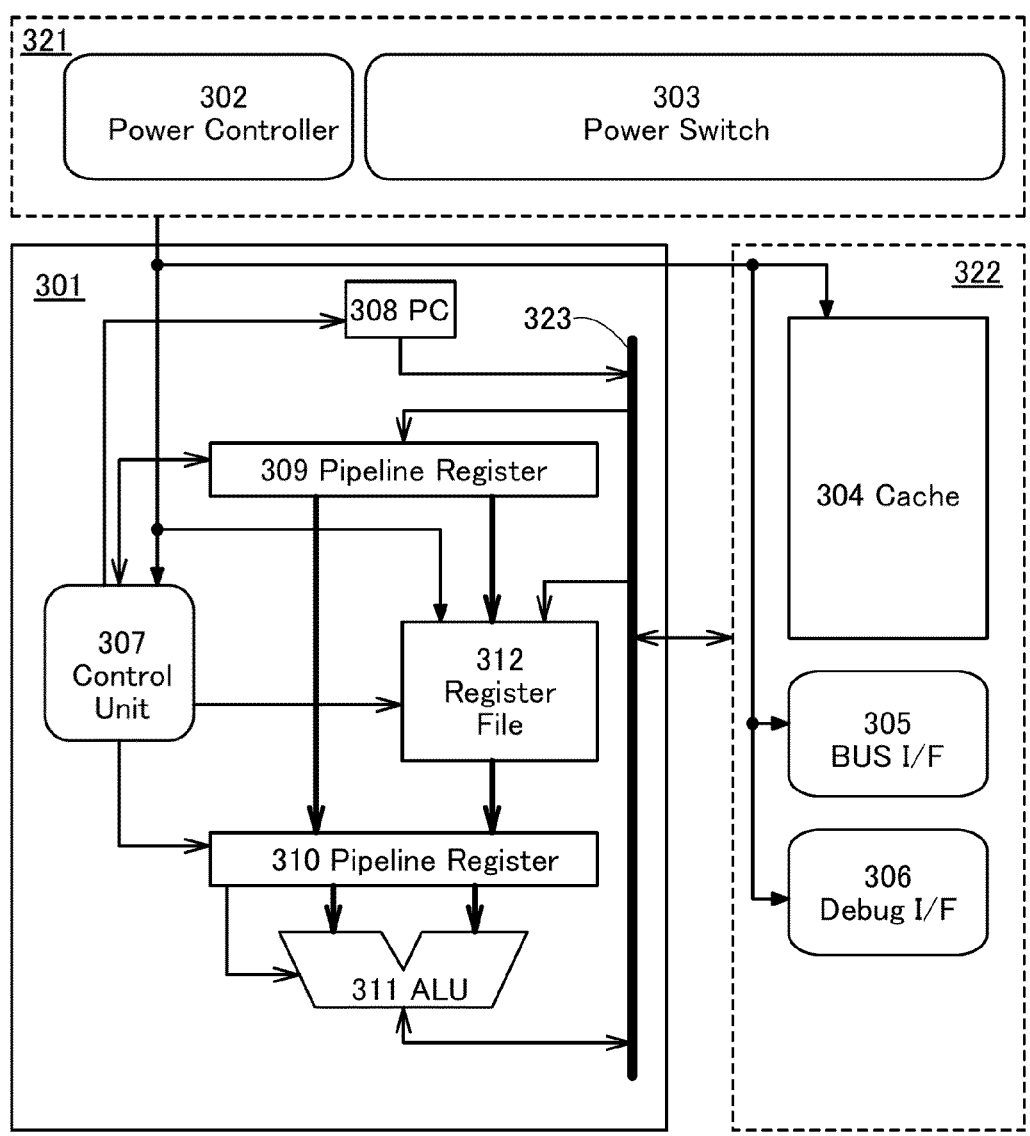
FIG. 7 illustrates a structure of a semiconductor device.

A semiconductor device 300 illustrated in FIG. 7 includes a CPU core 301, a power management unit 321, and a peripheral circuit 322. The power management unit 321 includes a power controller 302 and a power switch 303. The peripheral circuit 322 includes a cache 304 including cache memory, a bus interface (BUS UF) 305, and a debug interface (Debug UF) 306. The CPU core 301 includes a data bus 323, a control unit 307, a program counter (PC) 308, a pipeline register 309, a pipeline register 310, an arithmetic logic unit (ALU) 311, and a register file 312. Data is transmitted between the CPU core 301 and the peripheral circuit 322 such as the cache 304 via the data bus 323. The semiconductor device of one embodiment of the present invention can be applied to the program counter (PC) 308, the pipeline register 309, the pipeline register 310, and/or the register file 312, for example. Without limitations to these examples, the semiconductor device of one embodiment of the present invention can also be applied to other circuits including a register. Using the semiconductor device of one embodiment of the present invention for these circuits makes it possible to provide a semiconductor device that can aggressively reduce power consumption.

The control unit 307 has functions of decoding and executing instructions contained in a program such as inputted applications by controlling the overall operations of the PC 308, the pipeline registers 309 and 310, the ALU 311, the register file 312, the cache 304, the bus interface 305, the debug interface 306, and the power controller 302.

The ALU 311 has a function of performing a variety of arithmetic operations such as four arithmetic operations and logic operations.

The cache 304 has a function of temporarily storing frequently used data. The PC 308 is a register having a function of storing an address of an instruction to be executed next. Although not illustrated in FIG. 7, the cache 304 includes a cache controller for controlling the operation of the cache memory.

The pipeline register 309 has a function of temporarily storing instruction data.

The register file 312 includes a plurality of registers including a general purpose register and can save data that is read from the main memory of the control unit 307, data obtained as a result of arithmetic operations in the ALU 311, or the like.

The pipeline register 310 has a function of temporarily storing data used for arithmetic operations performed in the ALU 311, data obtained as a result of arithmetic operations in the ALU 311, or the like.

The bus interface 305 functions as a path for data between the semiconductor device 300 and devices outside the semiconductor device 300. The debug interface 306 functions as a path of a signal for inputting an instruction to control debugging to the semiconductor device 300. The bus interface 305 and the debug interface 306 are each provided with a register.

The power switch 303 has a function of controlling supply of the power supply voltage to circuits other than the power controller 302 in the semiconductor device 300. These circuits belong to several different power domains. The power switch 303 controls whether the power supply voltage is supplied to circuits in the same power domain. The power controller 302 has a function of controlling the operation of the power switch 303.

A description is made on an example of the power gating sequence in the semiconductor device 300 having the above configuration.

First, the CPU core 301 sets the timing for stopping the supply of the power supply voltage in a register of the power controller 302. Next, an instruction to start power gating is sent from the CPU core 301 to the power controller 302. Then, the registers and the cache 304 in the semiconductor device 300 start data saving. Subsequently, the power switch 303 stops the supply of the power supply voltage to the circuits other than the power controller 302 in the semiconductor device 300. Then, an interrupt signal is input to the power controller 302, thereby starting the supply of the power supply voltage to the circuits included in the semiconductor device 300. Note that a counter may be provided in the power controller 302 to be used to determine the timing of starting the supply of the power supply voltage regardless of input of an interrupt signal. Next, the registers and the cache 304 start data restoration. After that, execution of an instruction is resumed in the control unit 307.

Embodiment 8

In Embodiment 8, application examples of the semiconductor device in one embodiment of the present invention will be described.

Figure 8A:
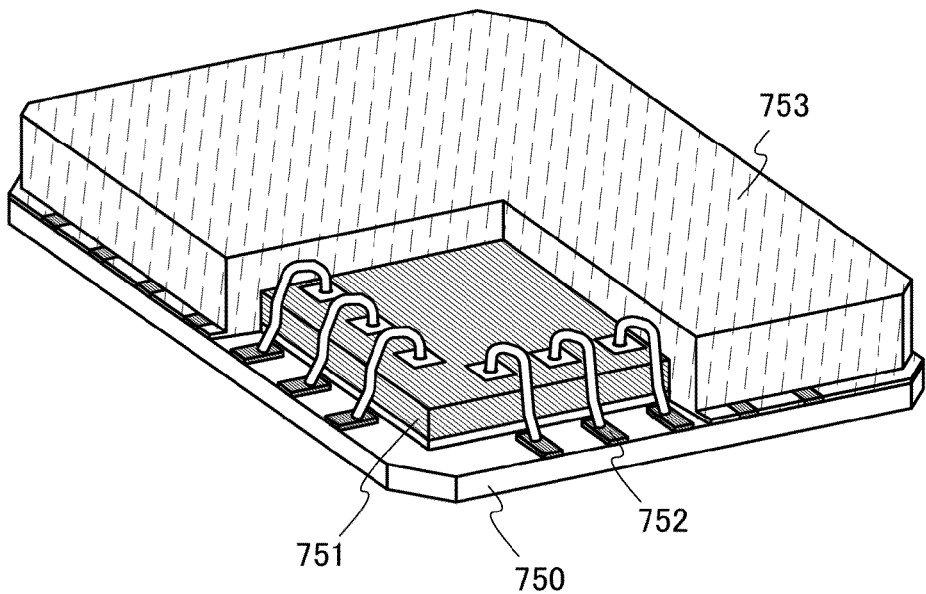
FIGS. 8A and 8B illustrate structures of a chip and a module.

FIG. 8A is a perspective view illustrating a cross-sectional structure of a package using a lead frame interposer. In the package illustrated in FIG. 8A, a chip 751 to which the semiconductor device of one embodiment of the present invention is applied is connected to a terminal 752 over an interposer 750 by wire bonding. The terminal 752 is placed on a surface of the interposer 750 on which the chip 751 is mounted. The chip 751 may be sealed by a mold resin 753, in which case the chip 751 is sealed so that part of each of the terminals 752 is exposed.

Figure 8B:
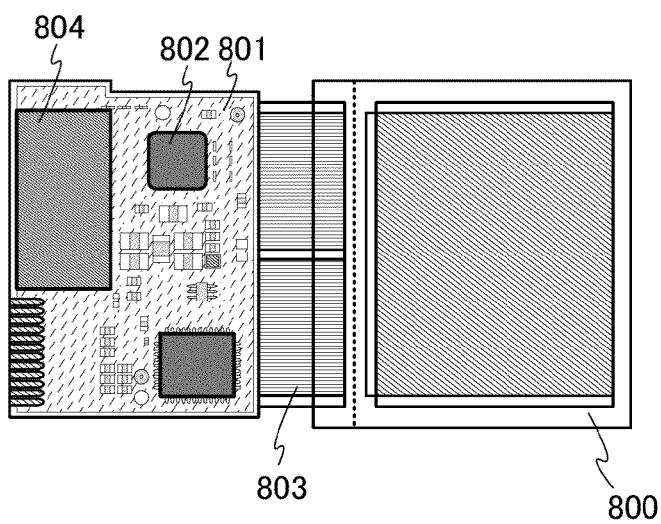

FIG. 8B illustrates the structure of a module of an electronic device (mobile phone) in which a package is mounted on a circuit board. In the module of the mobile phone in FIG. 8B, a package 802 and a battery 804 are mounted on a printed wiring board 801. The printed wiring board 801 is mounted on a panel 800 including a display element by an FPC 803.

Embodiment 9

In Embodiment 9, an example of structures of elements used in the semiconductor device of one embodiment of the present invention will be described with reference to FIG. 9.

Figure 9:
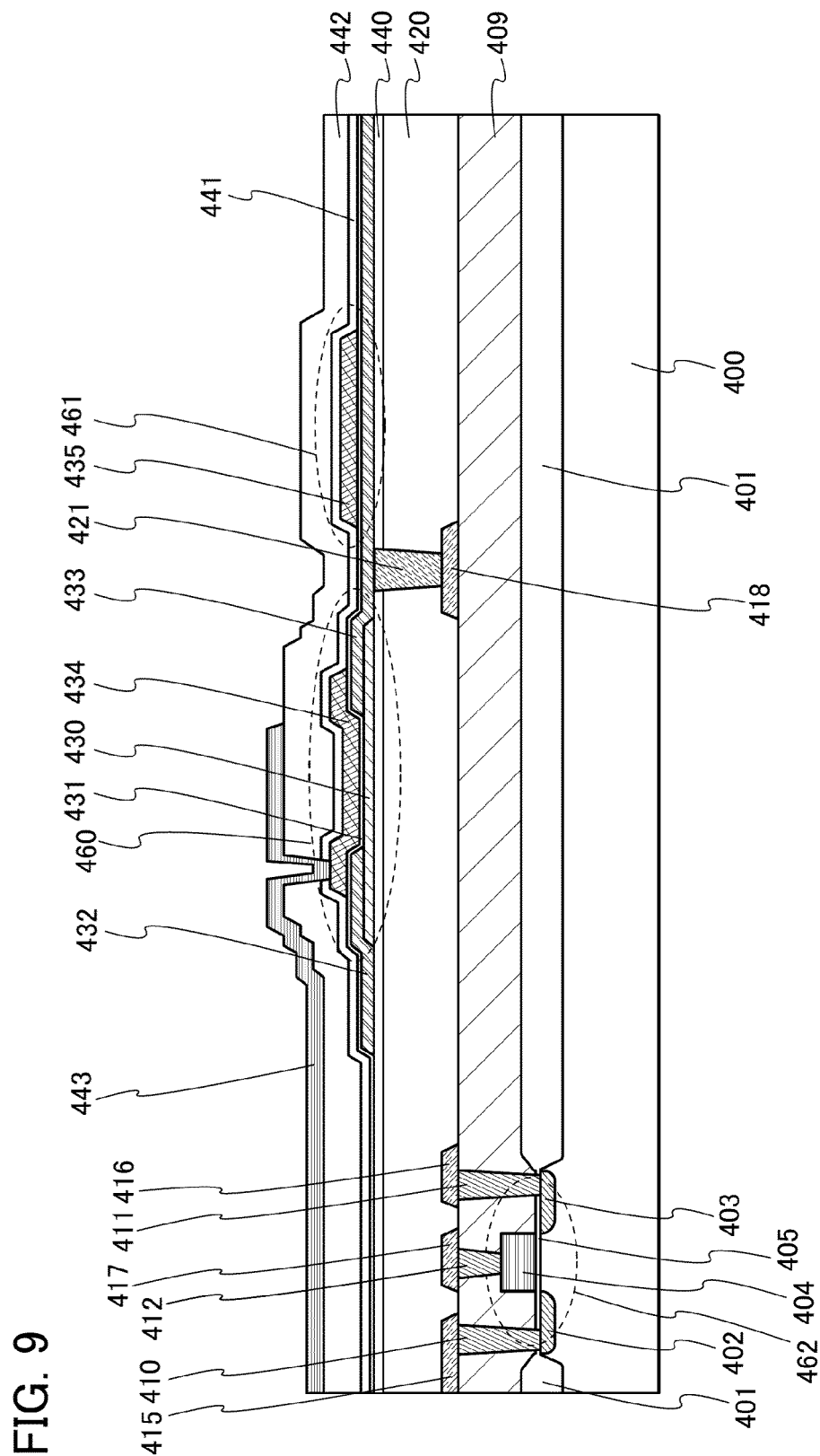
FIG. 9 illustrates a cross-sectional structure of a semiconductor device.

FIG. 9 illustrates a transistor 462 used in the second memory circuit 12, and a transistor 460 and a capacitor 461 used in the third memory circuit 13.

In the transistor 462, a channel formation region is provided in a single crystal silicon substrate 400 having n-type conductivity. Note that this is merely an example, and crystalline silicon such as polycrystalline silicon can be used for the transistor 462. Moreover, a single crystal silicon substrate having p-type conductivity can be used instead of the single crystal silicon substrate having n-type conductivity.

The transistor 462 is electrically isolated from other transistors by an element isolation insulating film 401. The transistor 462 includes impurity regions 402 and 403 that are formed in the single crystal silicon substrate 400 and function as a source region and a drain region, a gate electrode 404, and a gate insulating film 405 provided between the single crystal silicon substrate 400 and the gate electrode 404. The gate electrode 404 includes a region that overlaps a channel formation region formed between the impurity regions 402 and 403 with the gate insulating film 405 placed between the gate electrode 404 and the channel formation region.

An insulating film 409 is provided over the transistor 462. Openings are formed in the insulating film 409. A wiring 410 connected to the impurity region 402, a wiring 411 connected to the impurity region 403, and a wiring 412 electrically connected to the gate electrode 404 are formed in the openings.

The wiring 410 is electrically connected to a wiring 415 provided over the insulating film 409. The wiring 411 is electrically connected to a wiring 416 provided over the insulating film 409. The wiring 412 is electrically connected to a wiring 417 provided over the insulating film 409. A wiring 418 is provided over the insulating film 409.

An insulating film 420 and an insulating film 440 are stacked in this order over the wirings 415 to 418. An opening is formed in the insulating films 420 and 440. A wiring 421 electrically connected to the wiring 418 is provided in the opening.

The transistor 460 and the capacitor 461 are provided over the insulating film 440.

The transistor 460 includes an oxide semiconductor film 430, conductive films 432 and 433 that are positioned over the oxide semiconductor film 430 and function as a source electrode and a drain electrode, a gate insulating film 431 over the oxide semiconductor film 430 and the conductive films 432 and 433, and a gate electrode 434 that is positioned over the gate insulating film 431 and includes a region overlapping the oxide semiconductor film 430 between the conductive films 432 and 433. The conductive film 433 is electrically connected to the wiring 421.

A conductive film 435 is provided over the conductive film 433 with the gate insulating film 431 placed therebetween. A portion where the conductive film 435 overlaps the conductive film 433 with the gate insulating film 431 placed therebetween functions as the capacitor 461.

An insulating film 441 and an insulating film 442 are stacked in this order over the transistor 460 and the capacitor 461. An opening is formed in the insulating films 441 and 442. A conductive film 443 in contact with the gate electrode 434 is provided in the opening.

Next, a preferred structural example of the transistor 460 will be described.

As described in the foregoing embodiments, the transistor 460 used in the third memory circuit 13 is preferably capable of long-term data retention. As one way of having such properties, the transistor 460 used in the third memory circuit 13 needs to have sufficiently low off-state current.

An oxide semiconductor film should be used for a channel formation region to obtain a transistor having sufficiently low off-state current. Specifically, a highly purified oxide semiconductor (purified OS) obtained by reduction of impurities such as moisture or hydrogen serving as electron donors (donors) and reduction of oxygen vacancies is preferably used for a channel formation region. The purified oxide semiconductor is an i-type (intrinsic) semiconductor or a substantially i-type semiconductor. For this reason, a transistor having a channel formation region in a purified intrinsic or substantially purified intrinsic oxide semiconductor film has ultra-low off-state current and high reliability.

For example, in some cases, hydrogen in an oxide semiconductor film forms impurity states, whereby carrier density is increased. For this reason, a purified intrinsic or substantially purified intrinsic oxide semiconductor film preferably has a region with a hydrogen concentration of $5 \times 10^{21}$ atoms/cm$^3$ or less (preferably $5 \times 10^{20}$ atoms/cm$^3$ or less, more preferably $5 \times 10^{19}$ atoms/cm$^3$ or less, still more preferably $5 \times 10^{18}$ atoms/cm$^3$ or less). The hydrogen concentration is measured by secondary ion mass spectrometry (SIMS). Further, in some cases, nitrogen in an oxide semiconductor film forms impurity levels, which increase carrier density. For this reason, a purified intrinsic or substantially purified intrinsic oxide semiconductor film preferably has a region with a nitrogen concentration of less than $5 \times 10^{19}$ atoms/cm$^3$ (preferably $5 \times 10^{18}$ atoms/cm$^3$ or less, more preferably $1 \times 10^{18}$ atoms/cm$^3$ or less, still more preferably $5 \times 10^{17}$ atoms/cm$^3$ or less), which is obtained by SIMS.

Various experiments can prove low off-state current of a transistor including a channel formation region in a purified intrinsic or substantially purified intrinsic oxide semiconductor film. For example, the off-state current of even an element having a channel width of $1 \times 10^6$ μm (=1 m) and a channel length of 10 μm can be lower than or equal to the measurement limit of a semiconductor parameter analyzer, that is, lower than or equal to $1 \times 10^{-13}$ A at a voltage between the source and drain electrodes (drain voltage) of 1 V to 10 V. In this case, it can be seen that off-state current standardized on the channel width of the transistor is lower than or equal to 100 zA/μm. In addition, the off-state current is measured using a circuit in which a capacitor and a transistor are connected to each other and charge flowing into or from the capacitor is controlled by the transistor. In the measurement, a purified intrinsic or substantially purified intrinsic oxide semiconductor film is used for a channel formation region of the transistor, and the off-state current of the transistor is measured from a change in the amount of charge of the capacitor per unit time. As a result, it is found that when the voltage between the source and drain electrodes of the transistor is 3 V, a lower off-state current of several tens of yoctoamperes per micrometer (yA/μm), i.e., an off-state current of less than 100 yA/μm is obtained. As above, the off-state current of the transistor in which a purified intrinsic or substantially purified intrinsic oxide semiconductor film is used for a channel formation region is much lower than that of a transistor including crystalline silicon.

Note that an oxide semiconductor preferably contains at least indium (In) and/or zinc (Zn). In addition to indium (In) and/or zinc (Zn), the oxide semiconductor preferably contains gallium (Ga) as a stabilizer that reduces variations in electrical characteristics among transistors using the oxide semiconductor for a channel formation region. The oxide semiconductor may also contain tin (Sn), hafnium (Hf), aluminum (Al), or zirconium (Zr).

An In—Ga—Zn-based oxide and an In—Sn—Zn-based oxide among oxide semiconductors have the following advantages over silicon carbide, gallium nitride, and gallium oxide: transistors with excellent electrical characteristics can be formed by sputtering or a wet process and thus can be mass-produced easily. Moreover, unlike silicon carbide, gallium nitride, or gallium oxide, the In—Ga—Zn-based oxide allows a transistor with favorable electrical characteristics to be formed over a glass substrate and allows the use of a larger substrate.

The In—Ga—Zn-based oxide has sufficiently high resistance when no electric field is applied thereto, so that off-state current can be sufficiently reduced and mobility can be increased.

In this specification, an In—Ga—Zn-based oxide means an oxide containing In, Ga, and Zn, and there is no limitation on the ratio of In, Ga, and Zn. Further, the In—Ga—Zn-based oxide may contain a metal element other than In, Ga, and Zn. Interpretation of such notation in this specification applies to other elements.

For example, as an In—Ga—Zn-based oxide, an oxide with an atomic ratio of In:Ga:Zn=1:1:1 (=1/3:1/3:1/3) or 2:2:1 (=2/5:2/5:1/5) or an oxide with an approximate composition of the above oxide can be used. As an In—Sn—Zn-based oxide, an oxide with an atomic ratio of In:Sn:Zn= 1:1:1 (=1/3:1/3:1/3), 2:1:3 (=1/3:1/6:1/2), or 2:1:5 (=1/4:1/8:5/8) or an oxide with an approximate composition of the above oxide may be used.

Although whether an oxide semiconductor film has crystallinity is not particularly limited, the oxide semiconductor film may include non-single crystals, for example. Specific examples of non-single crystals are a c-axis aligned crystal (CAAC), a polycrystal, a microcrystal, and an amorphous part. Among these, the oxide semiconductor film preferably includes a CAAC. In this specification, an oxide semiconductor including a CAAC is called a c-axis aligned crystalline oxide semiconductor (CAAC-OS).

In an image obtained with a transmission electron microscope (TEM), for example, crystal parts can be found in the CAAC-OS in some cases. In most cases, in an image obtained with a TEM, crystal parts in the CAAC-OS each fit inside a cube whose one side is less than 100 nm, for example. In an image obtained with a TEM, a boundary between the crystal parts in the CAAC-OS or a grain boundary in the CAAC-OS is not clearly observed in some cases. Since a clear grain boundary does not exist in the CAAC-OS, for example, segregation of an impurity, high density of defect states, and a reduction in electron mobility is unlikely to occur.

For example, the CAAC-OS sometimes includes a plurality of crystal parts in which c-axes are aligned in a direction parallel to a normal vector of a surface where the CAAC-OS is formed or a normal vector of a surface of the CAAC-OS. When the CAAC-OS is analyzed by an out-of-plane method with an X-ray diffraction (XRD) apparatus, a peak appears at 2 θ of around 31° in some cases. In a crystal of InGaZnO$_4$, the peak at 2 θ of around 31° indicates a (009) crystal plane orientation. Further, in the CAAC-OS, a peak appears at 2 θ of around 36° in some cases. In a crystal of ZnGa$_2$O$_4$, the peak at 2 θ of around 36° indicates a (222) crystal plane orientation. In the CAAC-OS, it is preferable that the peak appear at 2 θ of around 31° and do not appear at 2θ of around 36°.

In the CAAC-OS, for example, among crystal parts, the directions of the a-axis and b-axis of one crystal part are sometimes different from those of another crystal part. For instance, when the CAAC-OS including a crystal of InGaZnO$_4$ is analyzed with an X-ray diffractometer by an in-plane method in which an X-ray enters a sample in a direction perpendicular to the c-axis, a peak appears at 2 θ of around 56° in some cases. The peak at 2 θ of around 56° is derived from the (110) plane of the InGaZnO$_4$ crystal. Here, when analysis (φ scan) is performed with 2θ fixed at around 56° and with a sample rotated using a normal vector of a surface of the sample as an axis (φ axis), a peak is not clearly observed in a sample of the CAAC-OS although six peaks having symmetry appear in a sample of a single crystal oxide semiconductor, in which the directions of the a-axis and b-axis of one crystal part are the same as those of another crystal part.

As described above, in a macroscopic view of the CAAC-OS, the c-axes are aligned and the a-axes and/or b-axes are not aligned in some cases, for example.

In each of the crystal parts included in the CAAC-OS, for example, the c-axis is aligned in a direction parallel to a normal vector of a surface where the CAAC-OS is formed or a normal vector of a surface of the CAAC-OS, triangular or hexagonal atomic arrangement that is seen from the direction perpendicular to the a-b plane is formed, and metal atoms are arranged in a layered manner or metal atoms and oxygen atoms are arranged in a layered manner when seen from the direction perpendicular to the c-axis. Note that among crystal parts, the directions of the a-axis and b-axis of one crystal part may be different from those of another crystal part. In this specification, the term "perpendicular" includes a range from 80° to 100°, preferably from 85° to 95°. In addition, the term "parallel" includes a range from −10° to 10°, preferably from −5° to 5°.

Since the c-axes of the crystal parts included in the CAAC-OS are aligned in the direction parallel to a normal vector of a surface where the CAAC-OS is formed or a normal vector of a surface of the CAAC-OS, the directions of the c-axes may be different from each other depending on the shape of the CAAC-OS film (the cross section of the surface where the CAAC-OS is formed or the cross section of the surface of the CAAC-OS). The film deposition is accompanied with the formation of the crystal parts or followed by the formation of the crystal parts through crystallization treatment such as heat treatment. Hence, the c-axes of the crystal parts are aligned in the direction parallel to a normal vector of the surface where the CAAC-OS is formed or a normal vector of the surface of the CAAC-OS.

The CAAC-OS can be obtained by reduction in the impurity concentration, for example. Here, the impurity means an element other than the main components of the oxide semiconductor, such as hydrogen, carbon, silicon, or a transition metal element. In particular, the bond strength of an element such as silicon with oxygen is higher than that of a metal element included in the oxide semiconductor; therefore, when the element abstracts oxygen in the oxide semiconductor, the atomic arrangement in the oxide semiconductor is disordered and the crystallinity of the oxide semiconductor is lowered in some cases. In addition, a heavy metal such as iron or nickel, argon, carbon dioxide, or the like has a large atomic radius (or molecular radius) and thus disorders the atomic arrangement in the oxide semiconductor, whereby the crystallinity of the oxide semiconductor is lowered in some cases. Hence, the CAAC-OS is an oxide semiconductor with a low impurity concentration. Note that the impurity included in the oxide semiconductor might serve as a carrier generation source.

In the CAAC-OS, distribution of crystal parts is not necessarily uniform. For example, in the formation process of the CAAC-OS, when crystal growth occurs from a surface side of the oxide semiconductor film, the proportion of crystal parts in the vicinity of the surface of the oxide semiconductor film is sometimes higher than that in the vicinity of the surface where the oxide semiconductor film is formed. Further, when an impurity is mixed into the CAAC-OS, the crystallinity of a crystal part in a region into which the impurity is mixed is lowered in some cases.

Further, the CAAC-OS can be formed by reduction in the density of defect states, for example. In an oxide semiconductor, for example, oxygen vacancies form defect states. The oxygen vacancies might serve as trap states or serve as carrier generation sources when hydrogen is trapped therein. In order to form the CAAC-OS, it is important to prevent oxygen vacancies from being generated in the oxide semiconductor, for example. Thus, the CAAC-OS is an oxide semiconductor with a low density of defect states. In other words, the CAAC-OS is an oxide semiconductor having few oxygen vacancies.

The state in which the impurity concentration is low and the density of defect states is low (the number of oxygen vacancies is small) is referred to as a "highly purified intrinsic" or "substantially highly purified intrinsic" state. A highly purified intrinsic or substantially highly purified intrinsic oxide semiconductor has few carrier generation sources, and thus has a low carrier density in some cases. Consequently, in some cases, a transistor including the oxide semiconductor in a channel formation region is less likely to have negative threshold voltage (to have normally-on characteristics). A highly purified intrinsic or substantially highly purified intrinsic oxide semiconductor has a low density of defect states and accordingly has a low density of trap states in some cases. Thus, the transistor including the oxide semiconductor in the channel formation region has a small variation in electrical characteristics and high reliability in some cases. A charge trapped by a trap state in an oxide semiconductor takes a long time to be released and may behave like a fixed charge. For this reason, a transistor that includes an oxide semiconductor with a high density of trap states in a channel formation region may have unstable electrical characteristics.

With the use of the highly purified intrinsic or substantially highly purified intrinsic CAAC-OS in a transistor, variation in the electrical characteristics of the transistor due to irradiation with visible light or ultraviolet light is small.

The CAAC-OS can be formed by sputtering using a DC power source, for example.

Table 1 shows comparison of the specifications between a memory circuit using a transistor including a film of a CAAC-OS containing an In—Ga—Zn-based oxide (hereinafter also referred to as CAAC-IGZO) and memory circuits using magnetoresistive random access memory (MRAM), resistive random access memory (ReRAM), and ferroelectric random access memory (FeRAM).

TABLE 1

|  | CAAC-IGZO | MRAM | ReRAM | FeRAM |
|---|---|---|---|---|
| Written power | | | | |
| Voltage | 2.5 V | 3.3 V | −1.5 V to +2 V | 1.5 V |
| Current | 0.1 A | 9 A | 170 A | — |
| Write time | 10 ns | 4 ns | 10 ns | 50 ns |
| Element size | 60 nm (channel length) | 50 nm (diameter) | 500 nm × 500 nm | 0.8 μm × 0.8 μm |
| Driving mode | Voltage | Current | Current | Current |

TABLE 1-continued

| | CAAC-IGZO | MRAM | ReRAM | FeRAM |
|---|---|---|---|---|
| Number of terminals | 4 | 2 | 2 | 2 |
| Equivalent circuit | 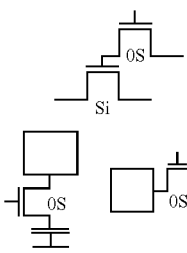 | 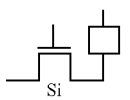 | 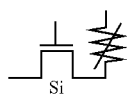 | 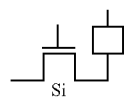 |

As described in the foregoing embodiments, the third memory circuit 13 can employ a structure capable of retaining data for a longer time than the second memory circuit 12. In view of this, an element included in the third memory circuit 13 can be MRAM, ReRAM, or FeRAM instead of the transistor using a CAAC-IGZO film. Note that as shown in Table 1, the memory circuit using a transistor including CAAC-IGZO for a channel formation region requires lower power for data writing than the other memory circuits. For example, a current necessary for data writing into MRAM is said to be 50 µA to 500 µA. On the other hand, when the transistor containing CAAC-IGZO for a channel formation region is used in the semiconductor device 10 having the structure in FIG. 3, a current needed for data writing can be approximately $\frac{1}{100}$ that of MRAM because data is saved by supply of charge to the capacitor 220. Accordingly, the third memory circuit 13 using the transistor containing CAAC-IGZO for a channel formation region has a preferable structure for reducing overhead power of the semiconductor device consumed by data saving and restoration.

This application is based on Japanese Patent Application serial no. 2013-064503 filed with Japan Patent Office on Mar. 26, 2013, the entire contents of which are hereby incorporated by reference.

What is claimed is:

1. A memory circuit comprising:
a first circuit configured to retain data in a first period during which a power supply voltage is supplied;
a second circuit configured to save the data retained in the first circuit in the first period and retain the data in a second period during which the power supply voltage is not supplied, the second circuit comprising:
a first transistor; and
a first node configured to maintain a potential;
a third circuit configured to save the data retained in the second circuit in the second period and retain the data in a third period during which the power supply voltage is not supplied, the third circuit comprising:
a second transistor; and
a second node configured to maintain a potential; and
a fourth circuit operationally connected to each of the first circuit, the second circuit, and the third circuit, wherein the fourth circuit is capable of reading the data retained in the second circuit based on the potential of the first node before the third circuit completes retaining the data in the third circuit.

2. The memory circuit according to claim 1, wherein the second transistor comprises an oxide semiconductor in a channel formation region.

3. The memory circuit according to claim 2, wherein the oxide semiconductor comprises indium and zinc.

4. The memory circuit according to claim 3, wherein the oxide semiconductor comprises gallium.

5. The memory circuit according to claim 1,
wherein the second circuit comprises a first capacitor electrically connected to the first transistor,
wherein the third circuit comprises a second capacitor electrically connected to the second transistor, and
wherein a capacitance of the first capacitor is larger than a capacitance of the second capacitor.

6. A method for driving a memory circuit,
the memory circuit comprising:
a first circuit configured to retain data in a first period during which a power supply voltage is supplied;
a second circuit configured to save the data retained in the first circuit in the first period and retain the data in a second period during which the power supply voltage is not supplied, the second circuit comprising:
a first transistor; and
a first node configured to maintain a potential;
a third circuit configured to save the data retained in the second circuit in the second period and retain the data in a third period during which the power supply voltage is not supplied, the third circuit comprising:
a second transistor; and
a second node configured to maintain a potential; and
a fourth circuit operationally connected to each of the first circuit, the second circuit, and the third circuit, wherein the fourth circuit is capable of reading the data retained in the second circuit based on the potential of the first node before the third circuit completes retaining the data in the third circuit,
the method comprising:
in the second period, turning on the second transistor and then turning off the second transistor.

7. The method according to claim 6, comprising turning off the first transistor in the first period.

8. A method for driving a semiconductor device,
the semiconductor device comprising:
a first memory circuit;
a second memory circuit comprising:
a first transistor comprising:
a first terminal electrically connected to the first memory circuit;
a second terminal; and
a gate;
a first capacitor comprising:
a first terminal electrically connected to the second terminal of the first transistor; and
a second terminal;

a third memory circuit comprising:
  a first wiring;
  a second transistor comprising:
    a first terminal electrically connected to the first wiring;
    a second terminal; and
    a gate electrically connected to the second terminal of the first transistor and the first terminal of the first capacitor;
  a third transistor comprising:
    a first terminal;
    a second terminal electrically connected to the second terminal of the second transistor; and
    a gate electrically connected to the first wiring, the first terminal of the second transistor, and the first terminal of the third transistor;
  a fourth transistor comprising:
    a first terminal electrically connected to the second terminal of the second transistor and the second terminal of the third transistor;
    a second terminal; and
    a gate;
  a second capacitor comprising:
    a first terminal electrically connected to the second terminal of the fourth transistor; and
    a second terminal;
a read circuit comprising:
  a second wiring;
  a fifth transistor comprising:
    a first terminal electrically connected to the second wiring;
    a second terminal electrically connected to the first memory circuit; and
    a gate;
  a sixth transistor comprising:
    a first terminal electrically connected to the second terminal of the fifth transistor and the first memory circuit;
    a second terminal; and
    a gate;
  a seventh transistor comprising:
    a first terminal electrically connected to the second terminal of the sixth transistor;
    a second terminal; and
    a gate electrically connected to the second terminal of the first transistor, the first terminal of the first capacitor, and the gate of the second transistor;
  an eighth transistor comprising:
    a first terminal electrically connected to the second terminal of the seventh transistor;
    a second terminal; and
    a gate electrically connected to the second terminal of the fourth transistor and the first terminal of the second capacitor; and
  a third wiring electrically connected to the second terminal of the eighth transistor,
wherein each of the first transistor and the sixth transistor is an n-channel transistor,
wherein each of the fifth transistor and the seventh transistor is a p-channel transistor,
wherein the fourth transistor comprises an oxide semiconductor in a channel formation region,
the method comprising:
a first step of turning off the first transistor;
after the first step, a second step of stopping supply of a high potential to the second wiring;
after the second step, a third step of starting supply of the high potential to the second wiring;
after the third step, a fourth step of turning off the fourth transistor.

9. The method according to claim 8, comprising:
a fifth step of supplying a low potential to the gate of the fifth transistor and the gate of the sixth transistor at the same time as or after the second step; and
a sixth step of supplying the high potential of the gate of the fifth transistor and the gate of the sixth transistor after the second step.

10. The method according to claim 9, comprising a seventh step of turning on the first transistor after the sixth step.

11. The method according to claim 8, comprising stopping supply of the high potential to the first wiring in the second step.

12. The method according to claim 8, comprising starting supply of the high potential to the first wiring in the third step.

13. The method according to claim 8, comprising an eighth step of turning on the fourth transistor between the second step and the third step.

* * * * *